United States Patent
Choi et al.

(10) Patent No.: US 10,833,229 B2
(45) Date of Patent: Nov. 10, 2020

(54) DISPLAY DEVICE USING SEMICONDUCTOR LIGHT EMITTING ELEMENT AND METHOD FOR MANUFACTURING SAME

(71) Applicant: LG ELECTRONICS INC., Seoul (KR)

(72) Inventors: Hwanjoon Choi, Seoul (KR); Yonghan Lee, Seoul (KR); Byungjoon Rhee, Seoul (KR); Jinhyoun Joe, Seoul (KR); Sungjin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/310,022

(22) PCT Filed: Mar. 7, 2017

(86) PCT No.: PCT/KR2017/002466
§ 371 (c)(1),
(2) Date: Dec. 14, 2018

(87) PCT Pub. No.: WO2018/004107
PCT Pub. Date: Jan. 4, 2018

(65) Prior Publication Data
US 2019/0252579 A1    Aug. 15, 2019

(30) Foreign Application Priority Data

Jun. 30, 2016  (KR) .................. 10-2016-0082828

(51) Int. Cl.
*H01L 33/50* (2010.01)
*H01L 33/58* (2010.01)
(Continued)

(52) U.S. Cl.
CPC ............ *H01L 33/504* (2013.01); *G02B 5/201* (2013.01); *H01L 25/0753* (2013.01);
(Continued)

(58) Field of Classification Search
CPC .... H01L 33/504; H01L 33/62; H01L 25/0753
(Continued)

(56) References Cited

U.S. PATENT DOCUMENTS

2002/0126194 A1 * 9/2002 Okabe .................. B41J 2/01
347/106
2007/0058107 A1    3/2007 Im et al.
(Continued)

FOREIGN PATENT DOCUMENTS

KR    10-2007-0078607 A    8/2007
KR    10-2015-0108650 A    9/2015
(Continued)

*Primary Examiner* — Igwe U Anya
(74) *Attorney, Agent, or Firm* — Birch, Stewart, Kolasch & Birch, LLP

(57) ABSTRACT

The present invention relates to a display device and, particularly, to a display device using a semiconductor light emitting element. The display device according to the present invention comprises: a substrate at which a wire electrode is formed; a plurality of semiconductor light emitting elements electrically connected to the wire electrode; a plurality of fluorescent material layers for converting a wavelength of light; a wavelength converting layer which has a plurality of partition wall portions formed between the plurality of fluorescent material layers and is disposed to cover the plurality of semiconductor light emitting elements; and a color filter which has a plurality of filtering portions for filtering blue, green, and red colors, and is disposed to cover the wavelength converting layer, wherein at least one of the plurality of filtering portions is configured to have a width different from those of the other filtering portions.

17 Claims, 21 Drawing Sheets

(51) Int. Cl.
  *H05B 33/12*   (2006.01)
  *H05B 33/22*   (2006.01)
  *G02B 5/20*    (2006.01)
  *H01L 25/075*  (2006.01)
  *H01L 33/62*   (2010.01)

(52) U.S. Cl.
  CPC .............. *H01L 33/50* (2013.01); *H01L 33/58* (2013.01); *H01L 33/62* (2013.01); *H05B 33/12* (2013.01); *H05B 33/22* (2013.01)

(58) Field of Classification Search
  USPC ........................................................... 257/89
  See application file for complete search history.

(56) References Cited

U.S. PATENT DOCUMENTS

| | | | | |
|---|---|---|---|---|
| 2011/0102706 | A1* | 5/2011 | Oshio | H01L 25/0753 349/61 |
| 2012/0235169 | A1* | 9/2012 | Seko | H01L 33/60 257/88 |
| 2014/0367633 | A1* | 12/2014 | Bibl | G02F 1/133603 257/13 |
| 2015/0323711 | A1* | 11/2015 | Bessho | G02B 5/0242 349/71 |
| 2015/0362165 | A1* | 12/2015 | Chu | H01L 25/0753 362/235 |
| 2017/0309853 | A1* | 10/2017 | Jang | H01L 33/20 |

FOREIGN PATENT DOCUMENTS

| | | |
|---|---|---|
| KR | 10-2015-0109342 A | 10/2015 |
| KR | 10-2016-0060904 A | 5/2016 |

\* cited by examiner

DISPLAY DEVICE USING SEMICONDUCTOR LIGHT EMITTING ELEMENT AND METHOD FOR MANUFACTURING SAME

CROSS-REFERENCE TO RELATED APPLICATIONS

This application is the National Stage filing under 35 U.S.C. 371 of International Application No. PCT/KR2017/002466, filed on Mar. 7, 2017, which claims the benefit of earlier filing date and right of priority to Korean Application No. 10-2016-0082828, filed on Jun. 30, 2016 in the Republic of Korea, the contents of all of these applications are all hereby incorporated by reference herein in their entirety.

FIELD

The present disclosure relates to a display device and a fabrication method thereof, and more particularly, to a flexible display device using a semiconductor light emitting element.

BACKGROUND

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting elements may be used to implement a flexible display, thereby presenting a scheme for solving the problems.

A structure of exciting light emitted from the semiconductor light emitting element using a wavelength conversion layer and filtering the light with a wavelength of red or green using a color filter may be applicable to the flexible display using the semiconductor light emitting element. In such a structure, a light amount of green or red may be insufficient relative to blue, and furthermore, there is a distance between the semiconductor light emitting element and the color filter, thereby causing a problem of deteriorating viewing angle characteristics. Therefore, the present disclosure proposes a mechanism for solving such a problem.

SUMMARY

An object of the present invention is to provide a display device in which structural reliability can be improved while securing a light amount of green or red in a display device.

An object of the present disclosure is to provide a display device capable of improving the viewing angle characteristics of blue.

A display device according to the present disclosure forms a color filter in an asymmetric structure while enlarging a filling space of phosphor, thereby increasing the luminance of green or red.

For a specific example, the display device may include a substrate on which wiring electrodes are formed, a plurality of semiconductor light emitting elements electrically connected to the wiring electrodes, a wavelength conversion layer provided with a plurality of phosphor layers for converting wavelengths of light and a plurality of partition wall portions formed between the plurality of phosphor layers, and disposed to cover the plurality of semiconductor light emitting elements, and a color filter provided with a plurality of filtering portions for filtering blue, green, and red colors, and disposed to cover the wavelength conversion layer, wherein at least one of the plurality of filtering portions has a width different from those of the other filtering portions.

According to an embodiment, at least one of the plurality of partition wall portions may overlap with at least one of the plurality of semiconductor light emitting elements along a thickness direction of the phosphor layer, and a filtering portion corresponding to a partition wall portion overlapping with at least one of the plurality of semiconductor light emitting elements among the plurality of filtering portions may have a width different from those of the other filtering portions.

Furthermore, the display device of the present disclosure may contain a light scattering or dispersing material only in a portion of filtering blue light as a structure of improving the viewing angle characteristics of blue.

For a specific example, at least one of the plurality of filtering portions having a different width from the other filtering portions may include a light scattering or dispersing material. The light scattering or dispersing material may be $TiO_2$, and have a size of 0.001 to 0.2 micrometers. The $TiO_2$ may include rutile $TiO_2$.

According to an embodiment, the color filter may include a light-transmissive base member in which the plurality of filtering portions are sequentially arranged.

The plurality of filtering portions each may include a blue filtering dye, a green filtering dye, and a red filtering dye arranged on one side of the base member, and the blue filtering dye may be mixed with a light scattering or dispersing material or the blue filtering dye may be disposed to overlap with a layer mixed with the light scattering or dispersing material.

In the display device according to the present disclosure, a color filter may be asymmetrically configured, thereby increasing the luminance of green or red. Furthermore, at least one of a plurality of partition wall portions may overlap with at least one of a plurality of semiconductor light emitting elements, thereby further securing a space for filling phosphors. Moreover, a width of a portion corresponding to a partition wall portion overlapping with at least one of the plurality of semiconductor light emitting elements in the color filter may be configured to be smaller than the other portions, thereby sufficiently securing the light amount of green and red. In addition, the leakage of blue color from a blue pixel may be alleviated and prevented, thereby improving color purity.

Besides, according to the present disclosure, light may be scattered or dispersed through a light scattering or dispersing material, thereby improving the viewing angle characteristics of blue. Therefore, a width of a portion of filtering blue light in the color filter may be formed narrower than that of the other portions.

BRIEF DESCRIPTION OF THE DRAWINGS

The embodiments will be described in detail with reference to the following drawings in which like reference numerals refer to like elements wherein.

DETAILED DESCRIPTION

Figure 1:
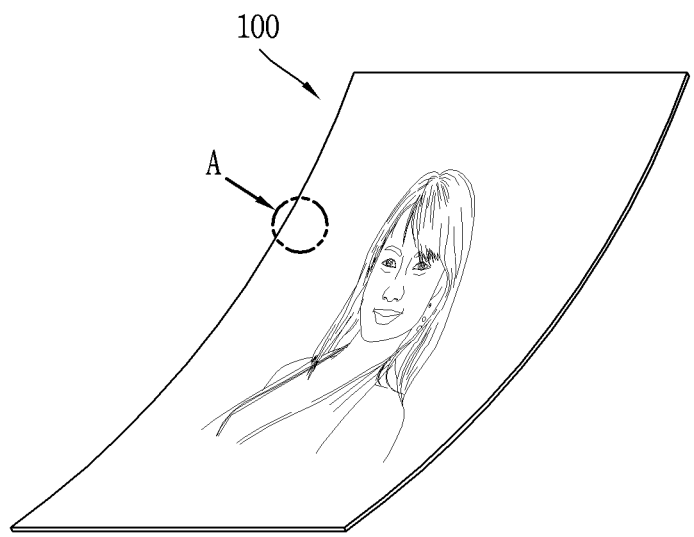
FIG. 1 is a conceptual view illustrating a display device using a semiconductor light emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light emitting element. According to the present disclosure, a light emitting diode (LED) is illustrated as a type of semiconductor light emitting element. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
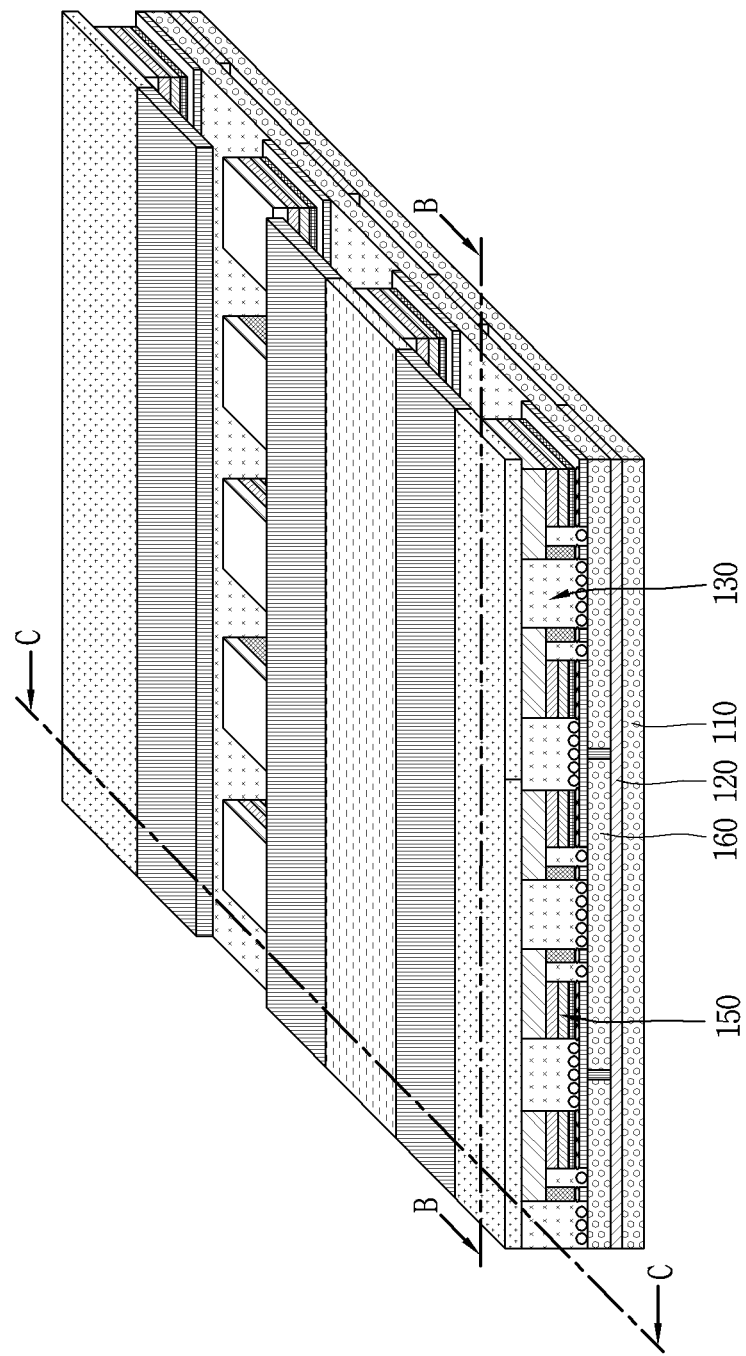
FIG. 2 is a partial enlarged view of portion "A" in FIG. 1, and FIGS. 3A and 3B are cross-sectional views taken along lines B-B and C-C in FIG. 2.
Figure 3A:
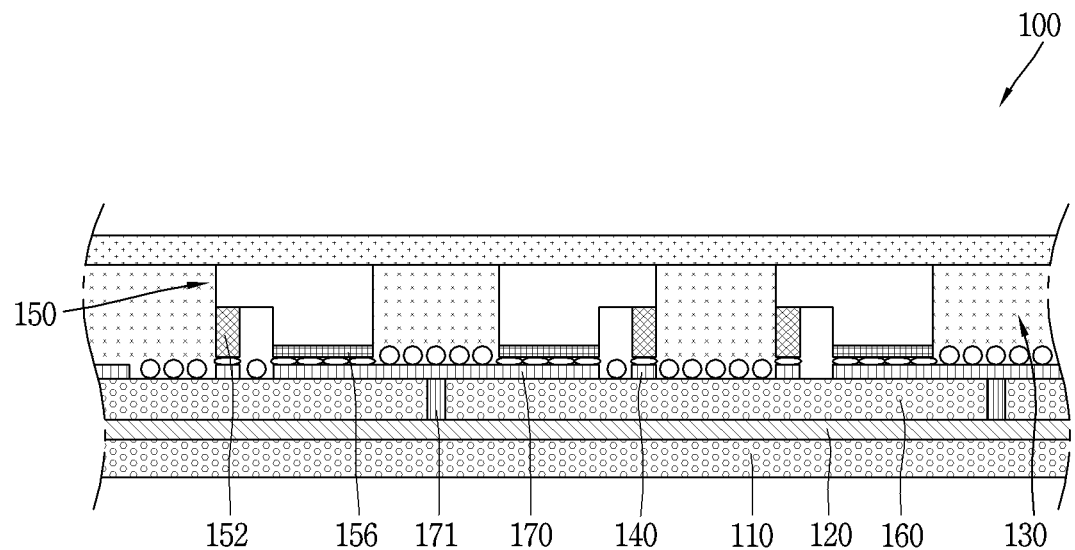
Figure 3B:
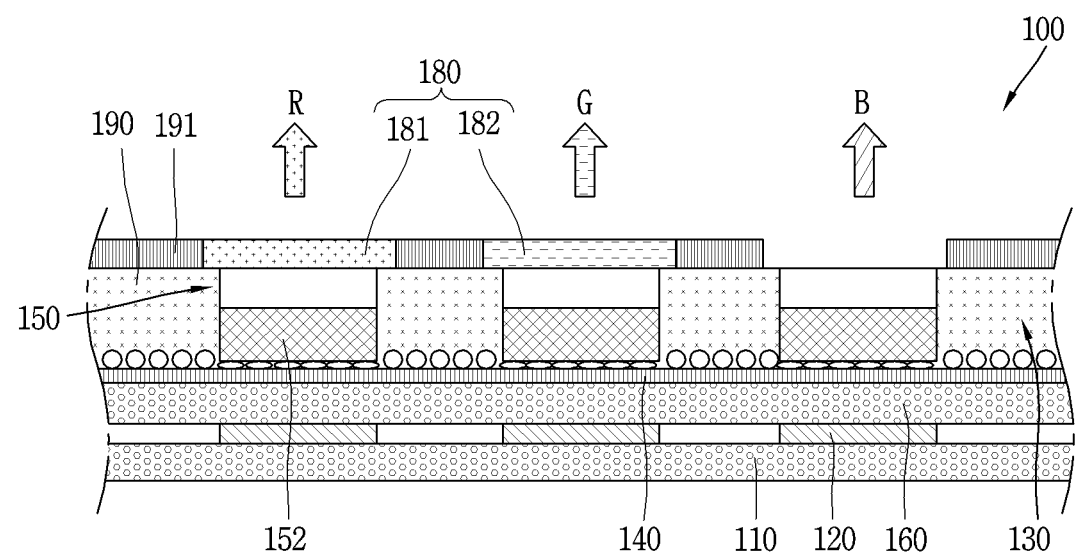
Figure 4:
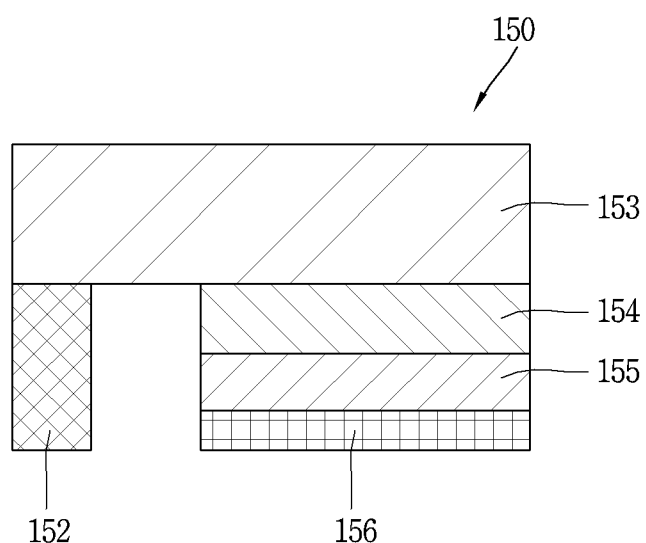
FIG. 4 is a conceptual view illustrating a flip chip type semiconductor light emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting element in FIG. 3A, and FIGS. 5A through 5C are conceptual views illustrating various forms for implementing colors in connection with a flip-chip type semiconductor light emitting element.

According to the drawings in FIGS. 2, 3A and 3B, there is illustrated a display device 100 using a passive matrix (PM) type semiconductor light emitting element as a display device 100 using a semiconductor light emitting element. However, an example described below may also be applicable to an active matrix (AM) type semiconductor light emitting element.

The display device 100 may include a substrate 110, a first electrode 120, a conductive adhesive layer 130, a second electrode 140, and a plurality of semiconductor light emitting elements 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting element 150 is connect thereto in a flip chip form with the application of heat and pressure, the semiconductor light emitting element 150 is electrically connected to the first electrode 120 and second electrode 140.

Referring to FIG. 4, the semiconductor light emitting element may be a flip chip type semiconductor light emitting element.

For example, the semiconductor light emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting elements 150. For example, the left and right p-type electrodes of the semiconductor light emitting elements around the auxiliary electrode may be electrically connected to one auxiliary electrode.

More specifically, the semiconductor light emitting element 150 is pressed into the conductive adhesive layer 130, and through this, only a portion between the p-type electrode 156 and auxiliary electrode 170 of the semiconductor light emitting element 150 and a portion between the n-type electrode 152 and second electrode 140 of the semiconductor light emitting element 150 have conductivity, and the remaining portion does not have conductivity since there is no push-down of the semiconductor light emitting element. As described above, the conductive adhesive layer 130 may form an electrical connection as well as allow a mutual coupling between the semiconductor light emitting element 150 and the auxiliary electrode 170 and between the semiconductor light emitting element 150 and the second electrode 140.

Furthermore, a plurality of semiconductor light emitting elements 150 constitute a light-emitting array, and a phosphor layer 180 is formed on the light-emitting array.

The light emitting device array may include a plurality of semiconductor light emitting elements with different self-luminance values. Each of the semiconductor light emitting elements 150 constitutes a sub-pixel, and is electrically connected to the first electrode 120. For example, there may exist a plurality of first electrodes 120, and the semiconductor light emitting elements are arranged in several rows, for instance, and each row of the semiconductor light emitting elements may be electrically connected to any one of the plurality of first electrodes.

Furthermore, the semiconductor light emitting elements may be connected in a flip chip form, and thus semiconductor light emitting elements grown on a transparent dielectric substrate. Furthermore, the semiconductor light emitting elements may be nitride semiconductor light emitting elements, for instance. The semiconductor light emitting element 150 has an excellent luminance characteristic, and thus it may be possible to configure individual sub-pixels even with a small size thereof.

According to the drawing, a partition wall 190 may be formed between the semiconductor light emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting element 150. For example, the semiconductor light emitting element 150 is a blue semiconductor light emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting element 151 at a location implementing a red sub-pixel, and a green phosphor 182 capable of converting blue light into green (G) light may be deposited on the blue semiconductor light emitting element 151 at a location implementing a green sub-pixel. Furthermore, only the blue semiconductor light emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting element 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
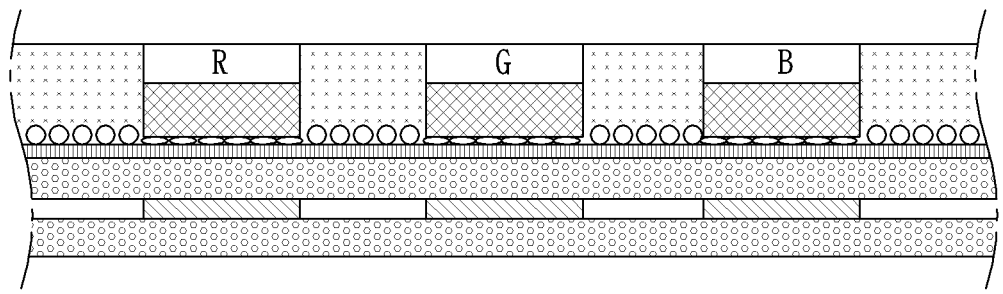
FIGS. 5A through 5C are conceptual views illustrating various forms for implementing colors in connection with a flip-chip type semiconductor light emitting element.

Referring to FIG. 5A, each of the semiconductor light emitting elements 150 may be implemented with a high-power light emitting device that emits various lights including blue in which gallium nitride (GaN) is mostly used, and indium (In) and or aluminum (Al) are added thereto.

In this case, the semiconductor light emitting element 150 may be red, green and blue semiconductor light emitting elements, respectively, to implement each sub-pixel. For instance, red, green and blue semiconductor light emitting elements (R, G, B) are alternately disposed, and red, green and blue sub-pixels implement one pixel by means of the red, green and blue semiconductor light emitting elements, thereby implementing a full color display.

Figure 5B:
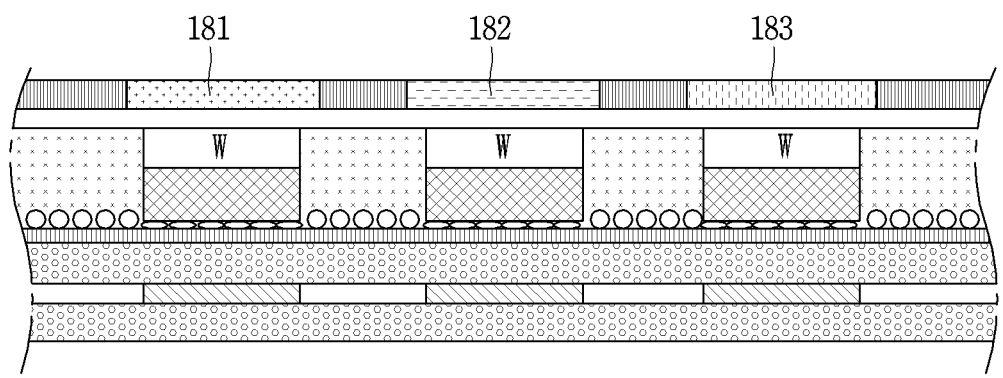

Referring to FIG. 5B, the semiconductor light emitting element may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
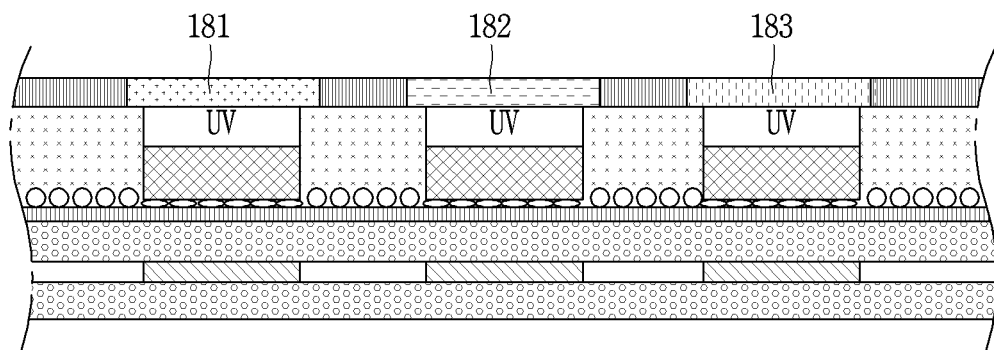

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting element can be used over the entire region up to ultra violet (UV) as well as visible light, and may be extended to a form of semiconductor light emitting element in which ultra violet (UV) can be used as an excitation source.

Taking the present example into consideration again, the semiconductor light emitting element 150 is placed on the conductive adhesive layer 130 to configure a sub-pixel in the display device. The semiconductor light emitting element 150 may have excellent luminance characteristics, and thus it may be possible to configure individual sub-pixels even with a small size thereof. The size of the individual semiconductor light emitting element 150 may be less than 80 µm in the length of one side thereof, and formed with a rectangular or square shaped element. In case of a rectangular shaped element, the size thereof may be less than 20×80 µm.

Furthermore, even when a square shaped semiconductor light emitting element 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light emitting elements becomes sufficiently large. Accordingly, in this case, it may be possible to implement a flexible display device having a HD image quality.

A display device using the foregoing semiconductor light emitting element will be fabricated by a new type of fabrication method. Hereinafter, the fabrication method will be described with reference to FIG. 6.

Figure 6:
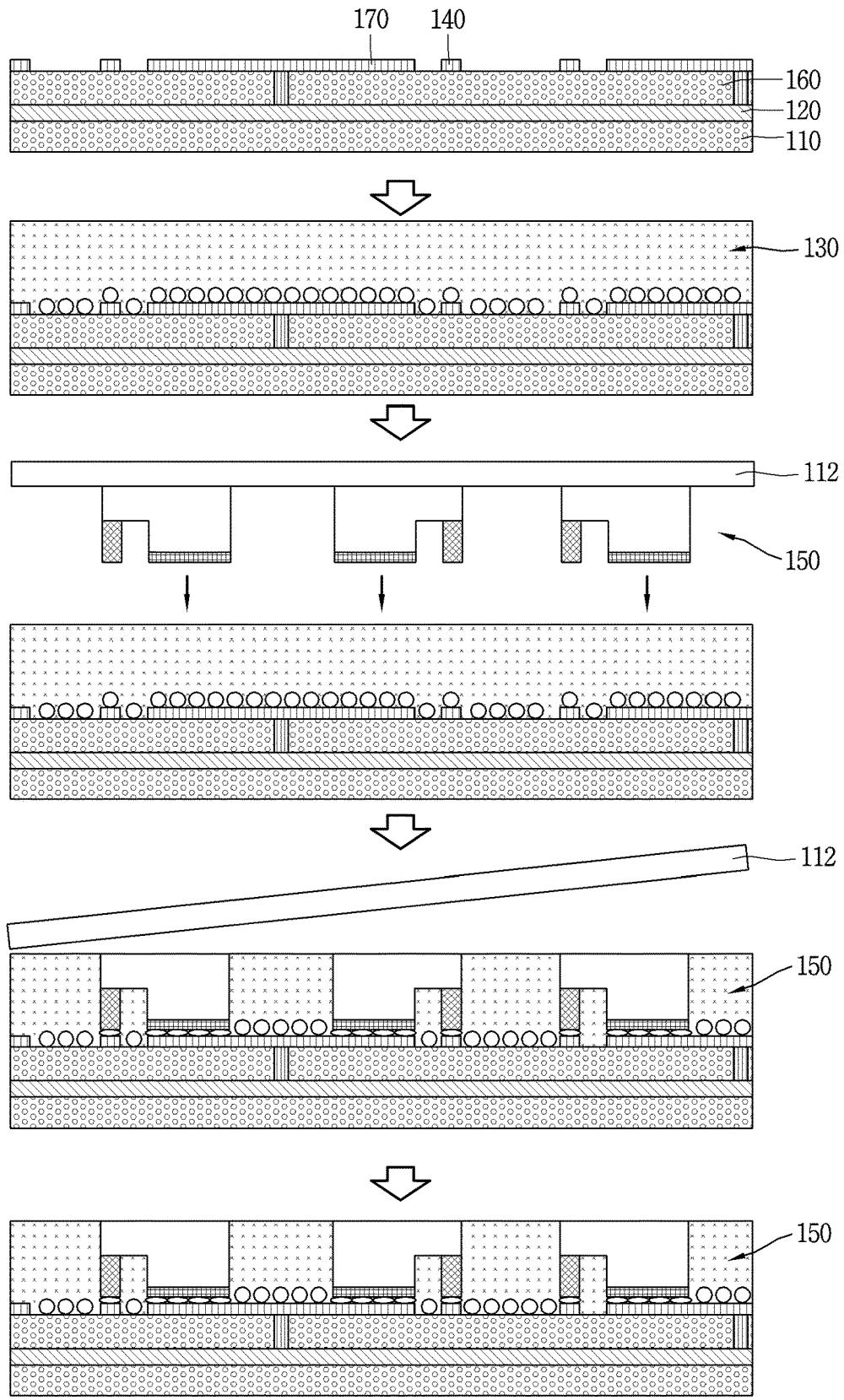
FIG. 6 is cross-sectional views illustrating a fabrication method of a display device using a semiconductor light emitting element according to the present disclosure.

FIG. 6 is cross-sectional views illustrating a fabrication method of a display device using a semiconductor light emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting elements 150 corresponding to the location of the auxiliary electrodes 170 and second electrodes 140 and constituting individual pixels is disposed such that the semiconductor light emitting element 150 faces the auxiliary electrode 170 and second electrode 140.

In this case, the second substrate 112 as a growth substrate for growing the semiconductor light emitting element 150 may be a sapphire substrate or silicon substrate.

The semiconductor light emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting element 150 and the auxiliary electrode 170 and second electrode 140 may have conductivity due to the characteristics of an anisotropic conductive film having conductivity by thermal compression, thereby allowing the electrodes and semiconductor light emitting element 150 to be electrically connected to each other. At this time, the semiconductor light emitting element 150 may be inserted into the anisotropic conductive film, thereby forming a partition wall between the semiconductor light emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting elements 150 to the outside. Silicon oxide (SiOx) or the like may be coated on the wiring substrate coupled to the semiconductor light emitting element 150 to form a transparent insulating layer (not shown).

Furthermore, it may further include the process of forming a phosphor layer on one surface of the semiconductor light emitting element 150. For example, the semiconductor light emitting element 150 may be a blue semiconductor light emitting element for emitting blue (B) light, and red or green phosphor for converting the blue (B) light into the color of the sub-pixel may form a layer on one surface of the blue semiconductor light emitting element.

The fabrication method or structure of a display device using the foregoing semiconductor light emitting element may be modified in various forms. For such an example, the foregoing display device may be applicable to a vertical semiconductor light emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
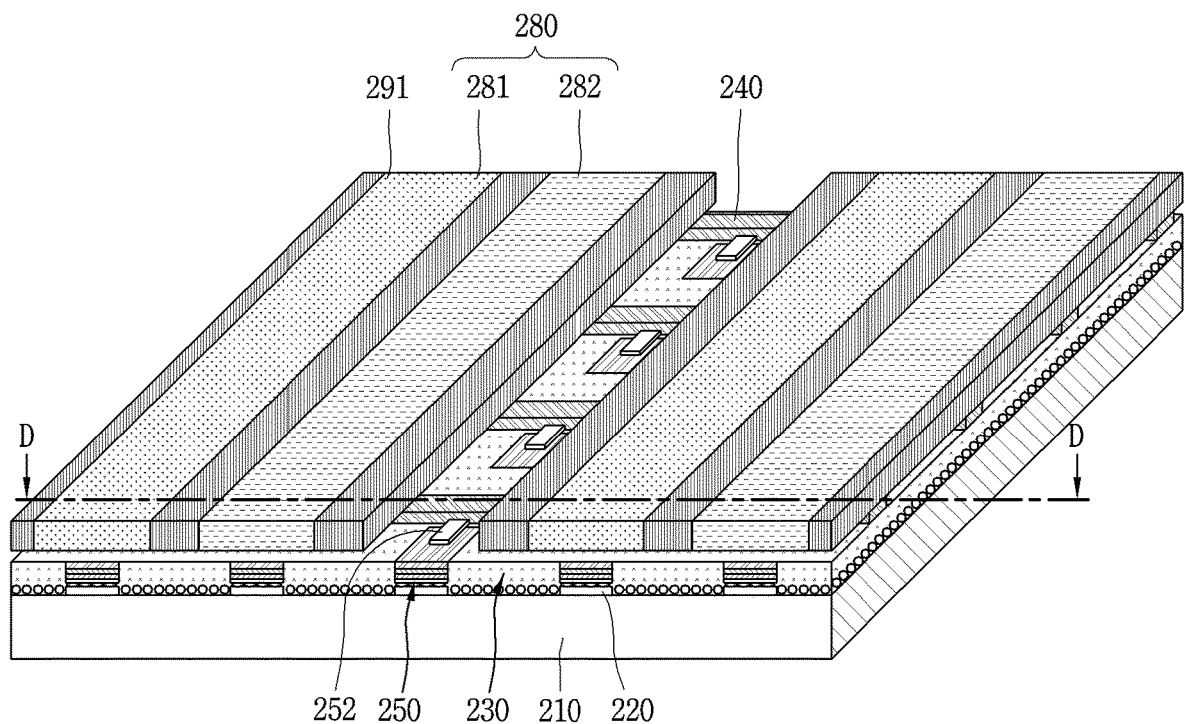
FIG. 7 is a perspective view illustrating a display device using a semiconductor light emitting element according to another embodiment of the present disclosure.
Figure 8:
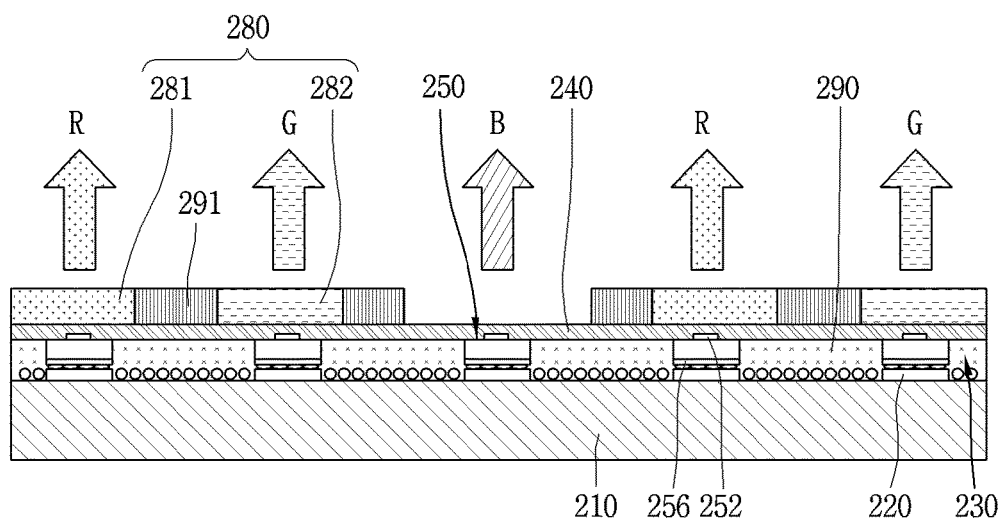
FIG. 8 is a cross-sectional view taken along line D-D in FIG. 7.
Figure 9:
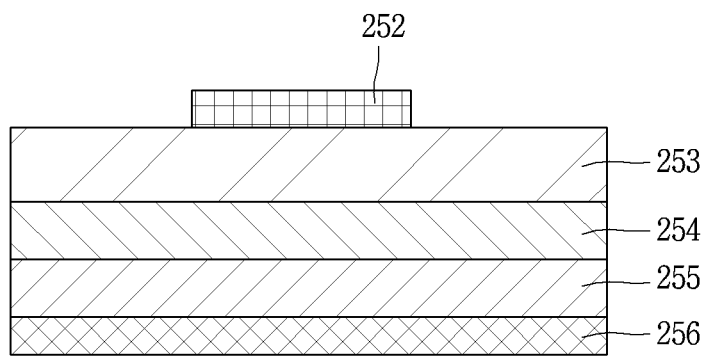
FIG. 9 is a conceptual view illustrating a vertical type semiconductor light emitting element in FIG. 8.

FIG. 7 is a perspective view illustrating a display device using a semiconductor light emitting element according to another embodiment of the present disclosure. FIG. 8 is a cross-sectional view taken along line C-C in FIG. 7, and FIG. 9 is a conceptual view illustrating a vertical type semiconductor light emitting element in FIG. 8.

According to the drawings, the display device may be display device using a passive matrix (PM) type of vertical semiconductor light emitting element.

The display device may include a substrate 210, a first electrode 220, a conductive adhesive layer 230, a second electrode 240 and a plurality of semiconductor light emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting element 250 thereto, the semiconductor light emitting element 250 is electrically connected to the first electrode 220. At this time, the semiconductor light emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting element 250 and the first electrode 220.

In this manner, the semiconductor light emitting element 250 is placed on the conductive adhesive layer 230, thereby configuring a separate sub-pixel in the display device. The semiconductor light emitting element 250 may have excellent luminance characteristics, and thus it may be possible to configure individual sub-pixels even with a small size thereof. The size of the individual semiconductor light emitting element 250 may be less than 80 μm in the length of one side thereof, and formed with a rectangular or square shaped element. In case of a rectangular shaped element, the size thereof may be less than 20×80 μm.

The semiconductor light emitting element 250 may be a vertical structure.

A plurality of second electrodes 240 disposed in a direction of crossing the length direction of the first electrode 220, and electrically connected to the vertical semiconductor light emitting element 250 may be located between vertical semiconductor light emitting elements.

Referring to FIG. 9, the vertical semiconductor light emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting element 250, thereby providing a great advantage capable of reducing the chip size.

Referring again to FIG. 8, a phosphor layer 280 may be formed on one surface of the semiconductor light emitting element 250. For example, the semiconductor light emitting element 250 is a blue semiconductor light emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting element 251 at a location implementing a red sub-pixel, and a green phosphor 282 capable of converting blue light into green (G) light may be deposited on the blue semiconductor light emitting element 251 at a location implementing a green sub-pixel. Furthermore, only the blue semiconductor light emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting elements 250, and electrically connected to the semiconductor light emitting elements 250. For example, the semiconductor light emitting elements 250 may be disposed in a plurality of rows, and the second electrode 240 may be located between the rows of the semiconductor light emitting elements 250.

Since a distance between the semiconductor light emitting elements 250 constituting individual pixels is sufficiently large, the second electrode 240 may be located between the semiconductor light emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light emitting element 250 by a connecting electrode protruded from the second electrode 240. More specifically, the connecting electrode may be an n-type electrode of the semiconductor light emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting element 250, the ITO material has a problem of bad adhesiveness with an n-type semiconductor. Accordingly, the second electrode 240 may be placed between the semiconductor light emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting elements 250. In other words, the partition wall 290 may be disposed between the vertical semiconductor light emitting elements 250 to isolate the semiconductor light emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light emitting elements 250, the partition wall 290 may be located between the semiconductor light emitting element 250 and second electrode 240. Accordingly, individual sub-pixels may be configured even with a small size using the semiconductor light emitting element 250, and a distance between the semiconductor light emitting elements 250 may be relatively sufficiently large to place the second electrode 240 between the semiconductor light emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting element 250 is located on the conductive adhesive layer 230, thereby constituting individual pixels on the display device. The semiconductor light emitting element 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light emitting element.

In a display device using the foregoing semiconductor light emitting element of the present disclosure, when a flip chip type is applied thereto, the first and second electrodes are disposed on the same plane, thereby causing a problem in which it is difficult to realize a fine pitch. Hereinafter, a display device to which a flip chip type light emitting device according to another embodiment of the present disclosure capable of solving such a problem is applied will be described.

Figure 10:
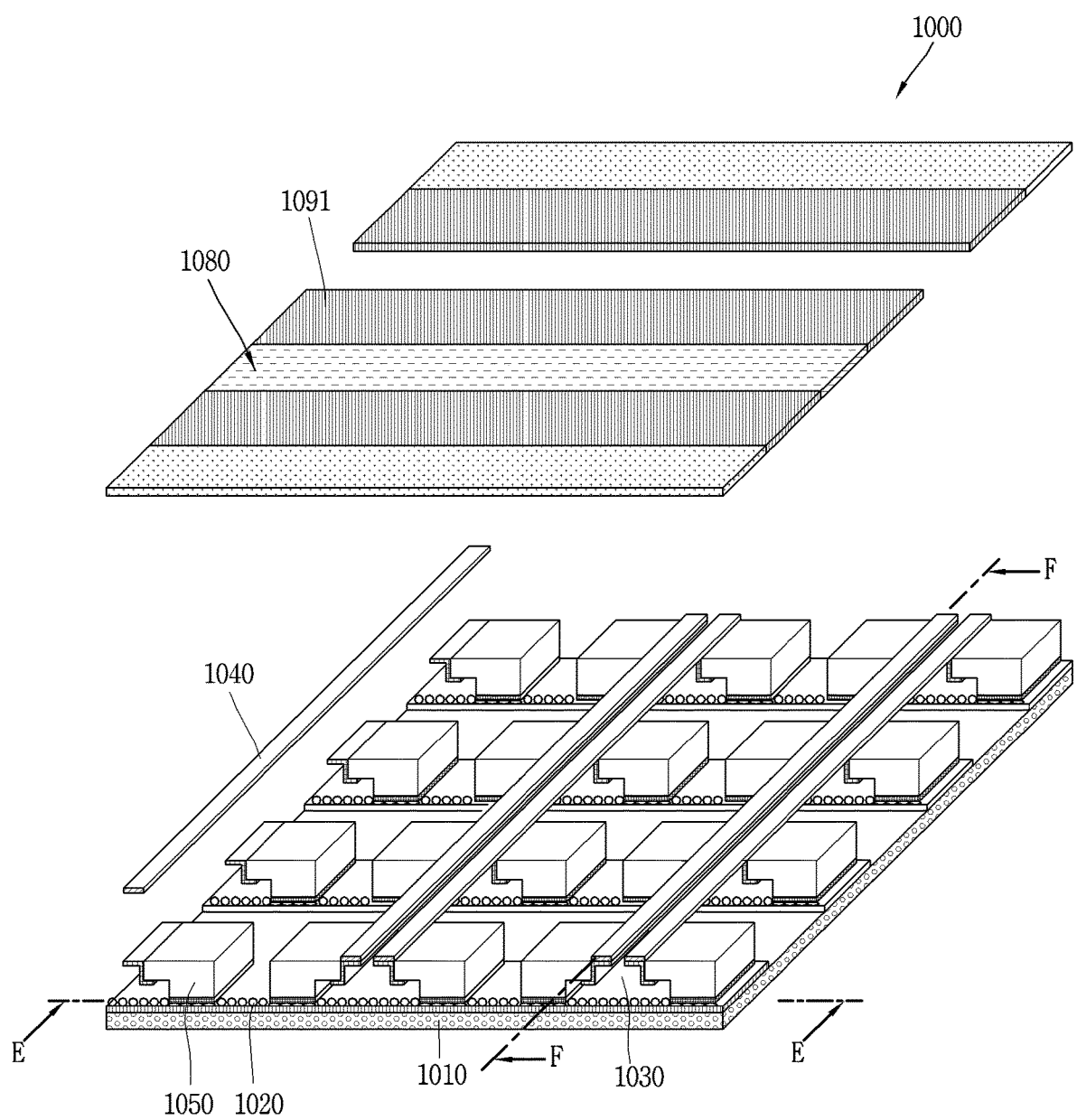
FIG. 10 is an enlarged view of portion "A" in FIG. 1 for explaining another embodiment of the present disclosure to which a semiconductor light emitting element having a new structure is applied.
Figure 11A:
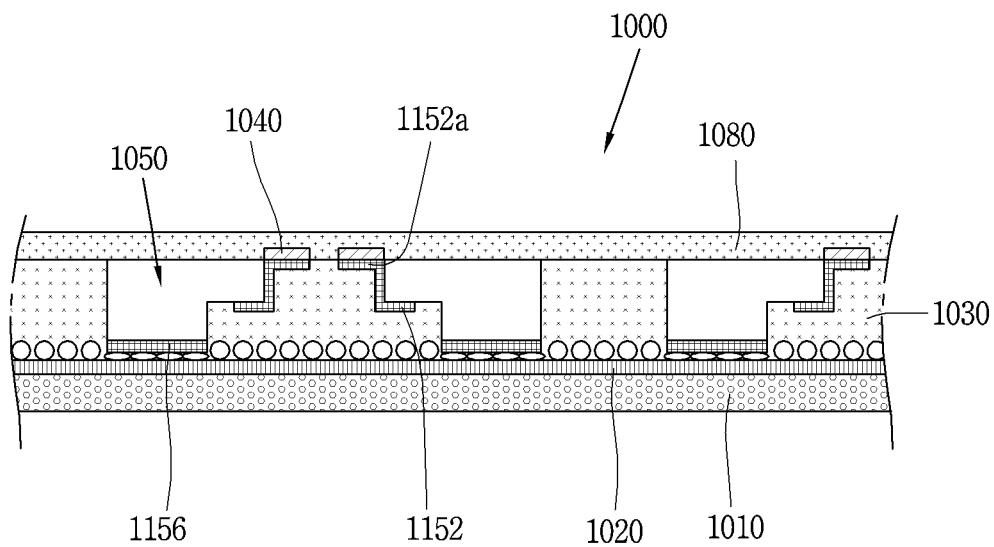
FIG. 11A is a cross-sectional view taken along line E-E in FIG. 10.
Figure 11B:
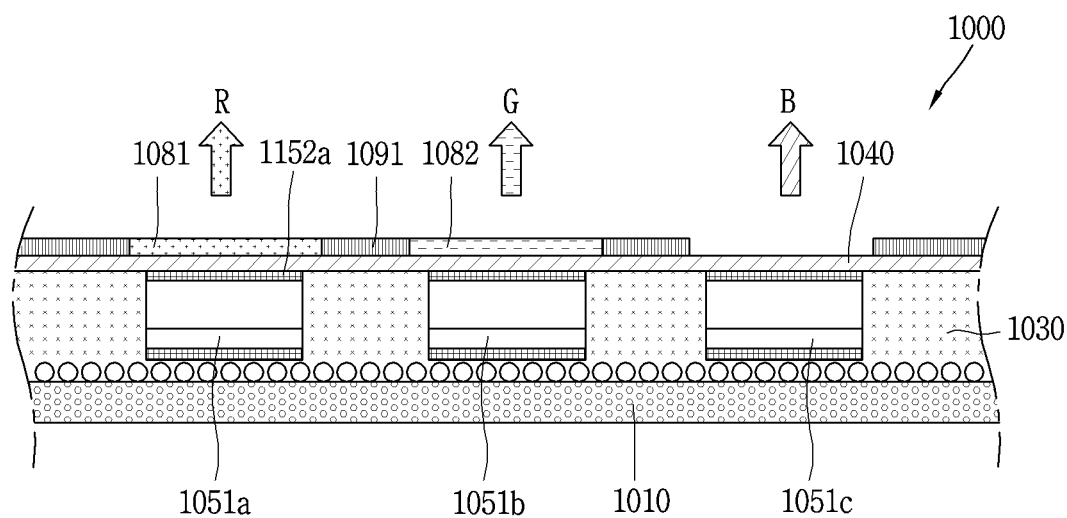
FIG. 11B is a cross-sectional view taken along line F-F in FIG. 11.
Figure 12:
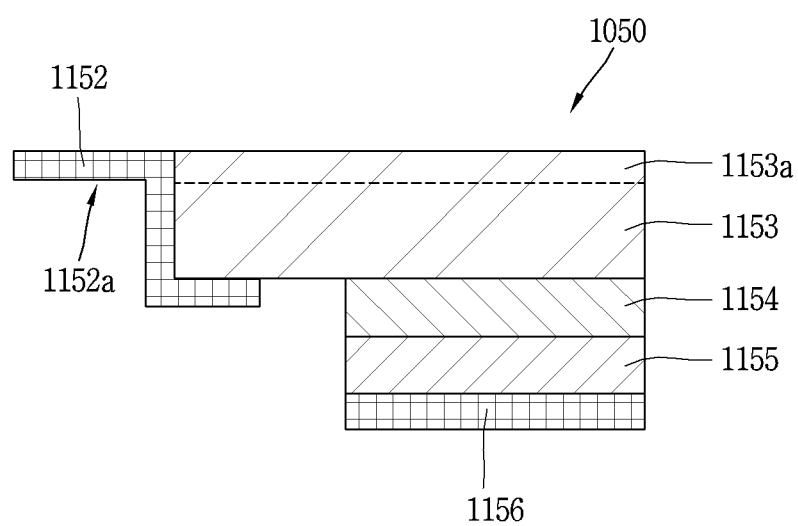
FIG. 12 is a conceptual view illustrating a flip chip type semiconductor light emitting element in FIG. 11A.

FIG. 10 is an enlarged view of portion "A" in FIG. 1 for explaining another embodiment of the present disclosure to which a semiconductor light emitting element having a new structure is applied, FIG. 11A is a cross-sectional view taken along line E-E in FIG. 10, FIG. 11B is a cross-sectional view taken along line F-F in FIG. 11, and FIG. 12 is a conceptual view illustrating a flip chip type semiconductor light emitting element in FIG. 11A.

According to the drawings in FIGS. 10, 11A and 11B, there is illustrated a display device 1000 using a passive matrix (PM) type semiconductor light emitting element as a display device 1000 using a semiconductor light emitting element. However, an example described below may also be applicable to an active matrix (AM) type semiconductor light emitting element.

The display device 1000 may include a substrate 1010, a first electrode 1020, a conductive adhesive layer 1030, a second electrode 1040, and a plurality of semiconductor light emitting elements 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display device to which the foregoing flip chip type light emitting device is applied, the conductive adhesive layer 1030 may be an anisotropic conductive film (ACF), an anisotropic conductive paste, a solution containing conductive particles, and the like. However, in the present embodiment, the conductive adhesive layer 1030 may be replaced with an adhesive layer. For example, when the first electrode 1020 is not located on the substrate 1010 but formed integrally with the conductive electrode of the semiconductor light emitting element, the adhesive layer may not need to have conductivity.

A plurality of second electrodes 1040 disposed in a direction of crossing the length direction of the first electrode 1020, and electrically connected to the semiconductor light emitting element 1050 may be located between the semiconductor light emitting elements.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected by contact with the semiconductor light emitting element 1050.

A plurality of semiconductor light emitting elements 1050 are coupled to the conductive adhesive layer 1030, and electrically connected to the first electrode 1020 and the second electrode 1040 by the foregoing structure.

According to circumstances, a transparent insulating layer (not shown) containing silicon oxide (SiOx) may be formed on the substrate 1010 formed with the semiconductor light emitting element 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As shown in the drawing, the plurality of semiconductor light emitting elements 1050 may form a plurality of columns in a direction parallel to a plurality of electrode lines provided in the first electrode 1020. However, the present disclosure is not necessarily limited thereto. For example, the plurality of semiconductor light emitting elements 1050 may form a plurality of columns along the second electrode 1040.

Moreover, the display device 1000 may further include a phosphor layer 1080 formed on one surface of the plurality of semiconductor light emitting elements 1050. For example, the semiconductor light emitting element 1050 is a blue semiconductor light emitting element that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting element 1051*a* at a location implementing a red sub-pixel, and a green phosphor 1082 capable of converting blue light into green (G) light may be deposited on the blue semiconductor light emitting element 1051*b* at a location implementing a green sub-pixel. Furthermore, only the blue semiconductor light emitting element 1051*c* may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light emitting element 1050 may be combined with a quantum dot (QD) or organic phosphor instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light emitting element 1051, but the black matrices 1091 may be respectively formed at both sides thereof by interposing a space that does not have the blue light emitting device 1051*c* therebetween.

Meanwhile, referring to the semiconductor light emitting element 1050 according to the present example, the electrodes may be disposed in an upward/downward direction in the semiconductor light emitting element 1050 in the present embodiment, thereby having a great advantage capable of reducing the chip size. However, the electrode may be disposed on the top and the bottom, but the semiconductor light emitting element may be a flip chip type semiconductor light emitting element.

Referring to FIG. 12, the semiconductor light emitting element 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

More specifically, the first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode is disposed on one surface of the second conductive semiconductor layer 1153, and an undoped semiconductor layer 1153*a* is formed on the other surface of the second conductive semiconductor layer 1153.

Referring to FIG. 12 together with FIGS. 10 through 11B, one surface of the second conductive semiconductor layer may be a surface closest to the wiring substrate, and the other surface of the second conductive semiconductor layer may be a surface farthest from the wiring substrate.

Furthermore, the first conductive electrode 1156 and the second conductive electrode 1152 may have a height difference from each other in width and vertical directions (or thickness direction) at positions spaced apart along the width direction of the semiconductor light emitting element.

The second conductive electrode 1152 is formed on the second conductive semiconductor layer 1153 using the height difference, but disposed adjacent to the second electrode 1040 located at an upper side of the semiconductor light emitting element. For example, at least part of the second conductive electrode 1152 may protrude from a side surface of the second conductive semiconductor layer 1153 (or a side surface of the undoped semiconductor layer 1153*a*). As described above, since the second conductive electrode 1152 protrudes from the side surface, the second conductive electrode 1152 may be exposed to an upper side of the semiconductor light emitting element. Through this, the second conductive electrode 1152 is disposed at a position overlapping the second electrode 1040 disposed at an upper side of the conductive adhesive layer 1030.

More specifically, the semiconductor light emitting element includes a protruding portion 1152*a* extending from the second conductive electrode 1152, and protruding from a side surface of the plurality of semiconductor light emitting elements. In this case, referring to the protruding portion 1152*a* as a reference, the first conductive electrode 1156 and the second conductive electrode 1152 are disposed at positions spaced apart along the protruding direction of the protruding portion 1152*a*, and may be expressed such that they are formed to have a height difference from each other in a direction perpendicular to the protruding direction.

The protruding portion 1152a extends laterally from one surface of the second conductive semiconductor layer 1153, and extends to an upper surface of the second conductive semiconductor layer 1153, and more specifically, to the undoped semiconductor layer 1153a. The protruding portion 1152a protrudes along the width direction from a side surface of the undoped semiconductor layer 1153a. Accordingly, the protruding portion 1152a may be electrically connected to the second electrode 1040 on the opposite side of the first conductive electrode with respect to the second conductive semiconductor layer.

A structure including the protruding portion 1152a may be a structure capable of using the above-described horizontal semiconductor light emitting element and vertical semiconductor light emitting element. On the other hand, fine grooves may be formed by roughing on an upper surface farthest from the first conductive electrode 1156 on the undoped semiconductor layer 1153a.

According to the above-described display device, light emitted from the semiconductor light emitting elements is excited using phosphors to implement red (R) and green (G). Furthermore, the above-described black matrices 191, 291, 1091, refer to FIGS. 3B, 8 and 11B) serve as partition wall portions for preventing color mixing between the phosphors. Accordingly, the present disclosure proposes a new type partition wall structure that allows a structure of a phosphor layer capable of widening a filling space of phosphor or having flexibility, which is different from that of the related art. Furthermore, in this case, a mechanism capable of solving a problem that the viewing angle characteristics of blue are relatively deteriorated is presented together.

Figure 13:
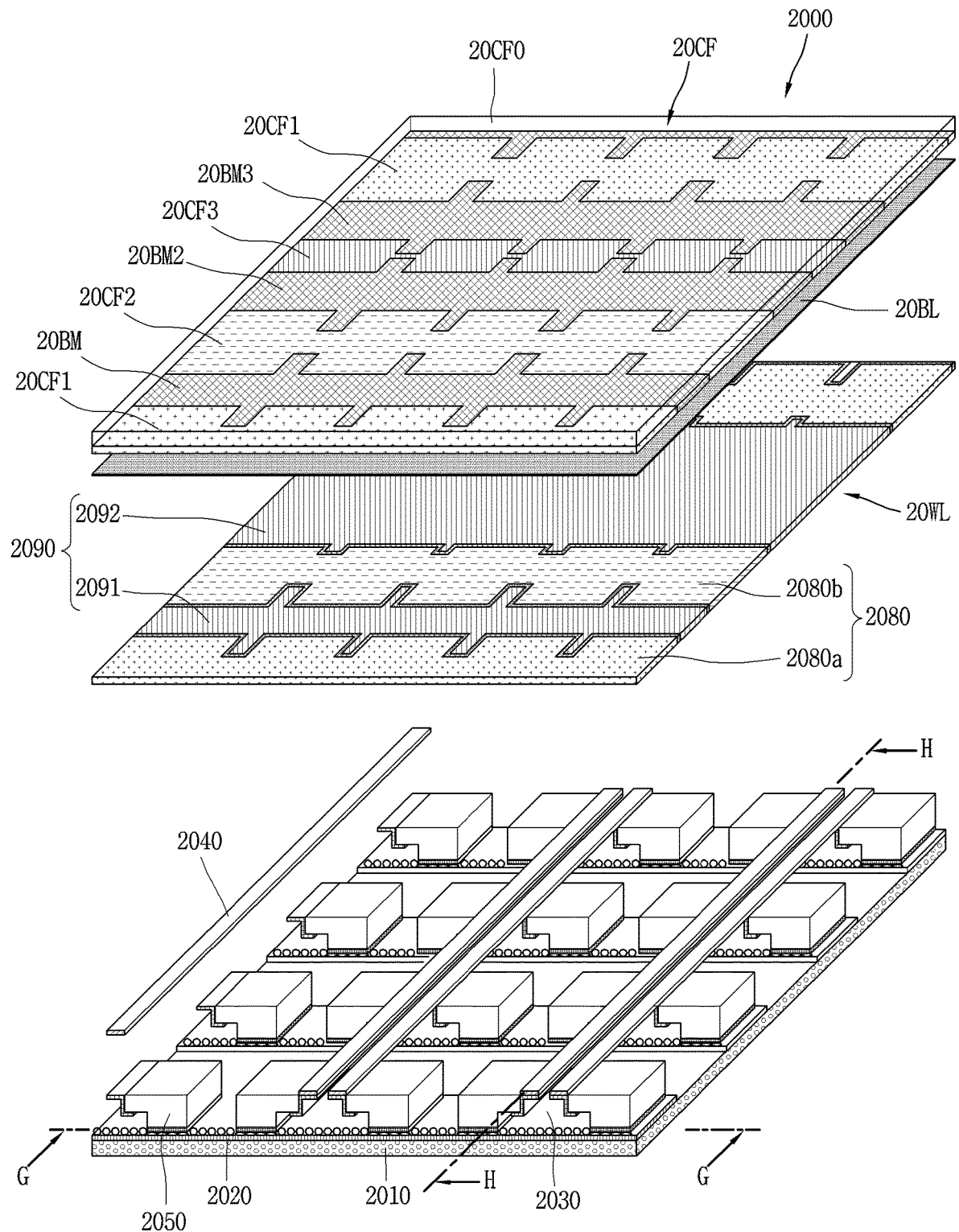
FIG. 13 is an enlarged view of portion "A" in FIG. 1 for explaining another embodiment of the present disclosure.
Figure 14:
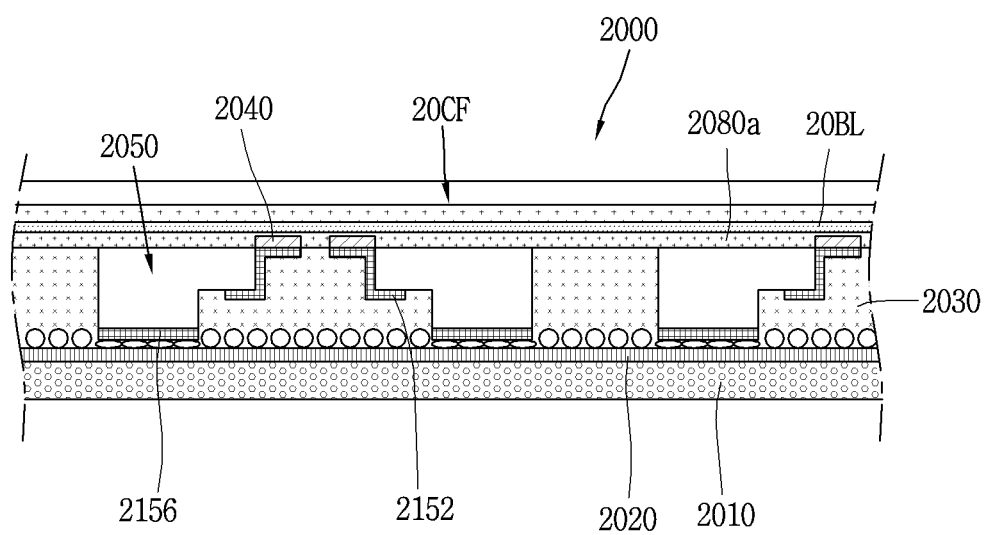
FIG. 14 is a cross-sectional view taken along line G-G in FIG. 13.
Figure 15:
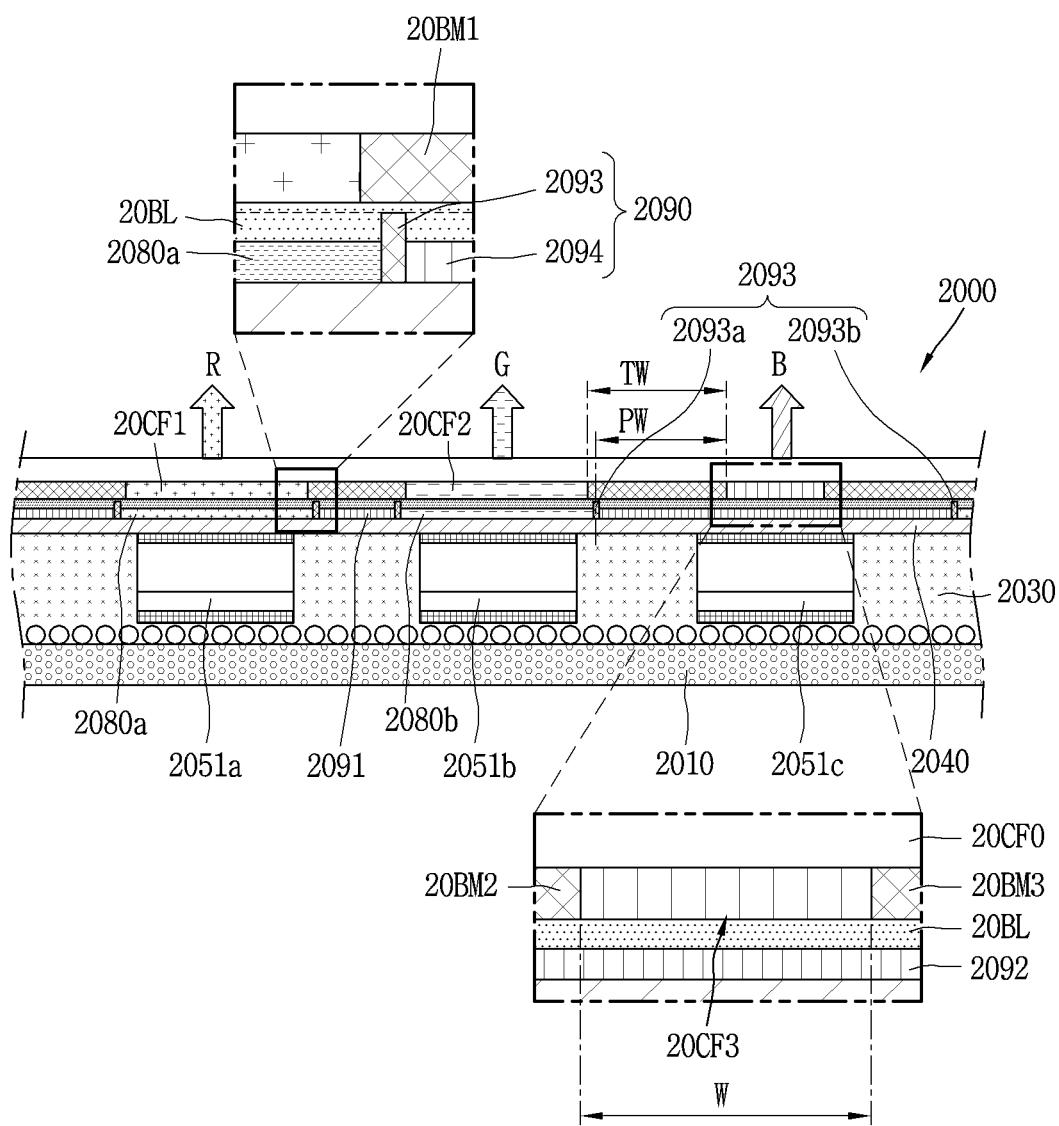
FIG. 15 is a cross-sectional view taken along line H-H in FIG. 13.

Hereinafter, the structure of a display device of the present disclosure will be described in detail with reference to the accompanying drawings. FIG. 13 is an enlarged view of portion "A" in FIG. 1 for explaining another embodiment of the present disclosure, and FIG. 14 is a cross-sectional view taken along line G-G in FIG. 13, and FIG. 15 is a cross-sectional view taken along line H-H in FIG. 13.

According to the drawings in FIGS. 13, 14 and 15, there is illustrated a display device 2000 using flip chip type semiconductor light emitting elements described with reference to FIGS. 10 through 12 display device 1000 as a display device using semiconductor light emitting elements. More specifically, there is illustrated a case in which a new phosphor layer structure is applied to a flip chip type semiconductor light emitting element described with reference to FIGS. 10 through 12. However, an example described below is also applicable to a display device using another type of semiconductor light emitting element described above.

In the present example to be described below, the same or similar reference numerals are designated to the same or similar components as those of the example described above with reference to FIGS. 10 through 12, and the description thereof will be substituted by the earlier description. For example, the display device 2000 includes a substrate 2010, a first electrode 2020, a conductive adhesive layer 2030, a second electrode 2040, and a plurality of semiconductor light emitting elements 2050, and the descriptions thereof will be substituted by the description with reference to FIGS. 10 through 12 as described above. Therefore, in the present embodiment, the conductive adhesive layer 2030 may be replaced with an adhesive layer, and a plurality of semiconductor light emitting elements may be attached to the adhesive layer disposed on the substrate 2010, and the first electrode 2020 may be integrally formed with a conductive electrode of the semiconductor light emitting element without being located on the substrate 2010.

The second electrode 2040 may be located on the conductive adhesive layer 2030. In other words, the conductive adhesive layer 2030 is disposed between the wiring substrate and the second electrode 2040. The second electrode 2040 may be electrically connected by contact with the semiconductor light emitting element 2050.

As described above, the display device 2000 may include a wavelength conversion layer 20WL disposed to cover a plurality of semiconductor light emitting elements 2050. For example, the semiconductor light emitting element 2050 is a blue semiconductor light emitting element that emits blue (B) light, and the wavelength converting layer 20WL performs the role of converting the blue (B) light into the color of a sub-pixel or converting the blue (B) light into yellow or white color.

According to the drawings, the wavelength conversion layer 20WL includes a plurality of phosphor layers 2080 for converting the wavelength of light and a plurality of partition wall portions 2090 formed between the plurality of phosphor layers 2080.

The plurality of phosphor layers 2080 may include a red phosphor layer 2080a having red phosphor and a green phosphor layer 2080b having green phosphor. In other words, a red phosphor layer 2080a capable of converting blue light into red (R) light may be deposited on the blue semiconductor light emitting element 2051a at a location implementing a red pixel, and a green phosphor layer 2080b capable of converting blue light into green (G) light may be deposited on the blue semiconductor light emitting element 2051b at a location implementing a green pixel.

On the other hand, one partition wall portion 2090 is disposed between the red phosphor layer 2080a and the green phosphor layer 2080b. In this case, at least one of the plurality of partition wall portions 2090 overlaps with at least one of the plurality of semiconductor light emitting elements along a thickness direction of the phosphor layer 2080. Furthermore, at least one of the plurality of partition wall portions 2090 is configured to transmit light along the thickness direction of the phosphor layer 2080. More specifically, one partition wall portion 2091 is disposed on the blue semiconductor light emitting element 2051c in a portion constituting a blue pixel, and light emitted from the blue semiconductor light emitting element 2051c is transmitted to the outside without any conversion of color.

In this case, a phosphor layer or a partition wall portion may be formed along each line of the first electrode 2020. Accordingly, one line on the first electrode 2020 may be an electrode controlling one color. Furthermore, red (R), green (B) and blue (B) may be sequentially disposed along the second electrode 2040, thereby implementing sub-pixels. However, the present disclosure may not be necessarily limited to this, and quantum dot (GD) or organic phosphor instead of phosphor may be filled into the phosphor layer to implement sub-pixels that emit red (R), green (G) and blue (B).

On the other hand, according to the illustration, the color filter 20CF is disposed to cover the wavelength conversion layer 20WL. More specifically, the color filter 20CF and the wavelength conversion layer 20WL may be combined by an adhesive layer 20BL. For example, as the adhesive layer 20BL is disposed between the color filter 20CF and the conversion layer 20WL, the color filter 20CF may be adhered to the conversion layer 20WL.

In this case, the color filter 20CF is made to selectively transmit light to implement red, green and blue colors. The color filter 20CF may be provided with a plurality of filtering portions for filtering a red wavelength, a green wavelength, and a blue wavelength, and may have a structure in which the plurality of filtering portions 20CF1, 20CF2, 20CF3 are repeatedly arranged. At this time, a red filtering portion 20CF1 and a green filtering portion 20CF2 for filtering red and green light are arranged on an upper side of the red phosphor layer 2080a and the green phosphor layer 2080b, respectively, and a blue filtering portion 20CF3 may be disposed to cover a partition wall portion 2092 of a portion constituting a blue pixel. Black matrices 20BM1, 20BM2, 20BM3 may be disposed between the plurality of filtering portions 20CF1, 20CF2, 20CF3.

In this case, the phosphor layer 2080 and the partition wall portion 2090 are combined with the color filter 20CF to implement the unit pixels of red, green, and blue.

For another example, all the phosphor layers may be filled with yellow phosphor other than red or green phosphor, and color filters (CFs) repeated with red, green, and blue may be arranged to cover the phosphor layer 2080.

On the other hand, the plurality of partition wall portions 2090 may include a first partition wall portion 2091 and a second partition wall portion 2092.

The first partition wall portion 2091 is disposed to cover a space between the plurality of semiconductor light emitting elements. Accordingly, at least part of the plurality of phosphor layers 2080 is disposed with the first partition 2091 therebetween. In this case, the at least part of the phosphor layers 2080 may include at least one of red phosphor, green phosphor, and yellow phosphor. More specifically, the first partition 2091 is located at a portion where a blue pixel is not disposed in a space between the red phosphor layer 2080a and the green phosphor layer 2080b that are repeatedly formed. Therefore, the semiconductor light emitting element is not disposed under the first partition wall portion 2091.

Meanwhile, the second partition wall portion 2092 is configured to cover at least one of the plurality of semiconductor light emitting elements. In this case, at least one of the plurality of semiconductor light emitting elements covered by the second partition wall portion 2092 includes the blue semiconductor light emitting element 2051c. In other words, the second partition wall portion 2092 is located at a portion where a blue pixel is not disposed in a space between the red phosphor layer 2080a and the green phosphor layer 2080b that are repeatedly formed. Therefore, the blue semiconductor light emitting element 2051c is disposed under the second partition wall portion 2092.

In order to implement the foregoing structure, the first partition wall portion 2091 and the second partition wall portion 2092 are respectively formed in a unit pixel that emits red (R), green (G), and blue (B). Furthermore, the first partition wall portion 2091 and the second partition wall portion 2092 may be formed to have different widths (W) formed along a direction perpendicular to the thickness direction of the phosphor layer 2080. In this case, the width of the first partition wall portion 2091 is formed smaller than that of the second partition wall portion 2092. The width of the second partition wall portion 2092 is greater than or equal to that of the semiconductor light emitting element 2050, and thus the width of the first partition wall portion 2091 is greater than that of the semiconductor light emitting element 2050.

In this case, the width of the second partition wall portion 2092 may be a distance (less than) from a width (distance between both ends) of an isolated blue semiconductor light emitting element 2051c to an end portion of an isolated blue semiconductor light emitting element 2051a corresponding to a red pixel (Or less) to an end portion of an isolated blue semiconductor light emitting element 2051b corresponding to a green pixel. Furthermore, a width of the phosphor layer 2080 may be formed to be greater than that of the semiconductor light emitting element 2050.

According to the illustration, only two partition wall portions exist in a unit pixel, and the width of one of the two (for example, the first partition wall portion) becomes smaller, and thus the width of the phosphor layer 2080 may be further increased. As described above, since the width of the phosphor layer 2080 is increased, a filling space of the phosphor layer may be secured more than that of the related art, and thus the amount of phosphor to be filled may be further increased.

Describing the structure of the partition wall portions 2090 in more detail with reference to FIGS. 14 and 15, at least one of the plurality of partition wall portions 2090 is provided with one or more thin metal layers 2093 formed at edges thereof, and a light transmitting material 2094 is filled into a space between the thin metal layers 2093.

The light transmitting material 2094 is a material having a high transmittance in a visible light region, and an epoxy-based PR (photoresist), PDMS (polydimethylsiloxane), resin or the like may be used, for example. These materials are suitable for use as a material for a partition wall portion applied to a flexible display, since they do not have a property of being rigid at high temperatures.

For example, the thin metal layers 2093 are configured to cover a side surface of the phosphor layer 2080 to reflect light.

The thin metal layers 2093 may include a first thin metal layer 2093a disposed at one side edge of the partition wall portions 2090 and a second thin metal layer 2093b disposed at the other side edge. The first thin metal layer 2093a and the second thin metal layer 2093b may each have a thickness of 50 to 1000 nanometers. More specifically, the first thin metal layer 2093a and the second thin metal layer 2093b may each have a thickness of 100 to 200 nanometers.

The thin metal layers 2093 do not exist at upper and lower ends of the partition wall portion. In other words, the first thin metal layer 2093a and the second thin metal layer 2093b are separated from each other along the width direction of the partition wall portion. Through this structure, light transmitted through the light transmitting material may be output from an upper end of the partition wall portion to the outside.

The first thin metal layer 2093a and the second thin metal layer 2093b are formed of a metal material such as aluminum or silver having a high reflectance in the visible light region to reflect light, thereby preventing color mixture between the phosphor layers. However, the present disclosure is not be necessarily limited thereto, and, for example, the thin metal layer may be replaced with an oxide thin film such as TiOx or CrOx, or a distribute Bragg reflector (DBR) structure may be applicable thereto.

The thin metal layers 2093 are formed of a single thin metal layer as illustrated in the drawing, but the present disclosure is not necessarily limited thereto. For example, the thin metal layers 2093 may be formed of a multilayer thin metal layer. For another example, an insulating film may be formed between the thin metal layer 2093 and the light transmitting material. The insulating layer may be formed of an opaque material such as SiO2, SiNx, or the like. For another example, the insulating film may be a black matrix. In this case, the black matrix may exhibit an additional effect of improving the contrast.

On the other hand, the adhesive layer 20BL disposed between the color filter 20CF and the wavelength conversion layer 20WL may be formed to fill at least part of a space between the thin metal layers 2093. In order to implement such a structure, a height of the light transmitting material 2094 in the partition wall portion may be adjusted, thereby compensating for an adhesive force between the wavelength conversion layer 20WL and the color filter 20CF.

More specifically, the light transmitting material 2094 may be formed at a lower height than the thin metal layers 2093. Here, the height may be defined as a distance from the semiconductor light emitting element or the conductive adhesive layer. Since the light transmitting material 2094 is lower in height than the thin metal layers 2093, a portion not disposed with the light transmitting material 2094 is formed in a space between the thin metal layers 2093, and an adhesive material of the adhesive layer 20BL is filled into the portion not disposed with the light transmitting material. According to such a structure, the adhesive material fills at least part of a space between the thin metal layers 2093, and thus the adhesion space may be increased to compensate for an adhesive force between the wavelength conversion layer 20WL and the color filter 20CF.

Meanwhile, in the color filter 20CF of the present example, at least one of the plurality of filtering portions 20CF1, 20CF2, and 20CF3 may be formed to have a width different from that of the other filtering portions. For example, at least one of the plurality of partition wall portions overlaps with at least one of the plurality of semiconductor light emitting elements along the thickness direction of the phosphor layer 2080, and the filtering portion 20CF3 corresponding to a partition wall portion overlapping with at least one of the plurality of semiconductor light emitting elements among the plurality of filtering portions 20CF1, 20CF2, 20CF3 is configured to have a width different from those of the other filtering portions 20CF1, 20CF2.

More specifically, a width of at least one of green and red filtering portions 20CF1, 20CF2 is made to be different from that of the blue filtering portion 20CF3 in conjunction with further securing a filling space for green and red phosphors, thereby forming an asymmetric color filter. In this case, the second partition wall portion 2092 covering the blue semiconductor light emitting element overlaps with the blue filtering portion 20CF3, and a width of the blue filtering portion 20CF3 is formed to have a smaller width than those of the green and red filtering portions 20CF1, 20CF2.

For such an example, widths of the green filtering portion and the red filtering portion 20CF1, 20CF2 may be 5 to 50% larger than that of the blue filtering portion 20CF3. For a more specific example, the widths of the green filtering portion 20CF1 and the red filtering portion 20CF2 may be 5% larger than the width (W) of the blue filtering portion 20CF3. In the case of using the blue semiconductor light emitting element as a light source, the blue pixel has a problem in that the luminous flux is large in adjusting the white balance, and the luminance improvement of the red and green colors is required. In this example, the widths of the green filtering portion 20CF1 and the red filtering portion 20CF2 are formed to be 5% larger than the width (W) of the blue filtering portion 20CF3 in the color filter to solve the problem.

Meanwhile, the black matrices 20BM1, 20BM2, 20BM3 between the plurality of filtering portions 20CF1, 20CF2, 20CF3 may be disposed at different positions with respect to the partition wall portion.

For such an example, the first black matrix 20BM1 disposed between the green filtering portion 20CF1 and the red filtering portion 20CF2 is aligned on the same line as the first partition wall portion 2091. More specifically, a vertical center line of the first black matrix 20BM1 may be located on a vertical center line of the first partition wall portion 2091.

Furthermore, the second and third black matrices 20BM2, 20BM3 disposed on both sides of the blue filtering portion 20CF3 are respectively formed such that an overlapped portion with the second partition wall portion 2092 is larger than a non-overlapped portion therewith. For example, the second and third black matrices 20BM2, 20BM3 may be formed such that a portion closer to the blue filtering portion 20CF3 is larger with respect to a side edge of the second partition wall portion 2092. More specifically, the second and third black matrices 20BM2, 20BM3 may be formed to have a length of 50% or more in a blue pixel direction with respect to the thin metal layer 2093. The width (PW) of a portion closer to the blue filtering portion on the second and third black matrices 20BM2, 20BM3 with respect to the thin metal layer may be 50% larger than the width (TW) of the second and third black matrices 20BM2, 20BM3.

According to the above-described structure, an opening of each pixel is adjusted so that the color filter matches a lower partition wall structure, thereby improving the red and green luminance and reducing the blue color leakage to improve the color purity.

In this case, at least one of the phosphor layers 2080 is configured to mix phosphor 2082 in resin 2081, and the phosphor 2082 may include an inorganic phosphor. In this case, the inorganic phosphor needs a certain height to convert the wavelength of light. For example, the height of the phosphor layer 2080 may be about 30 micrometers. Therefore, when the width of the blue filtering portion 20CF3 is reduced, the viewing angle characteristics may be degraded in the blue color. In the present invention, another embodiment capable of solving such a problem is presented.

Figure 16:
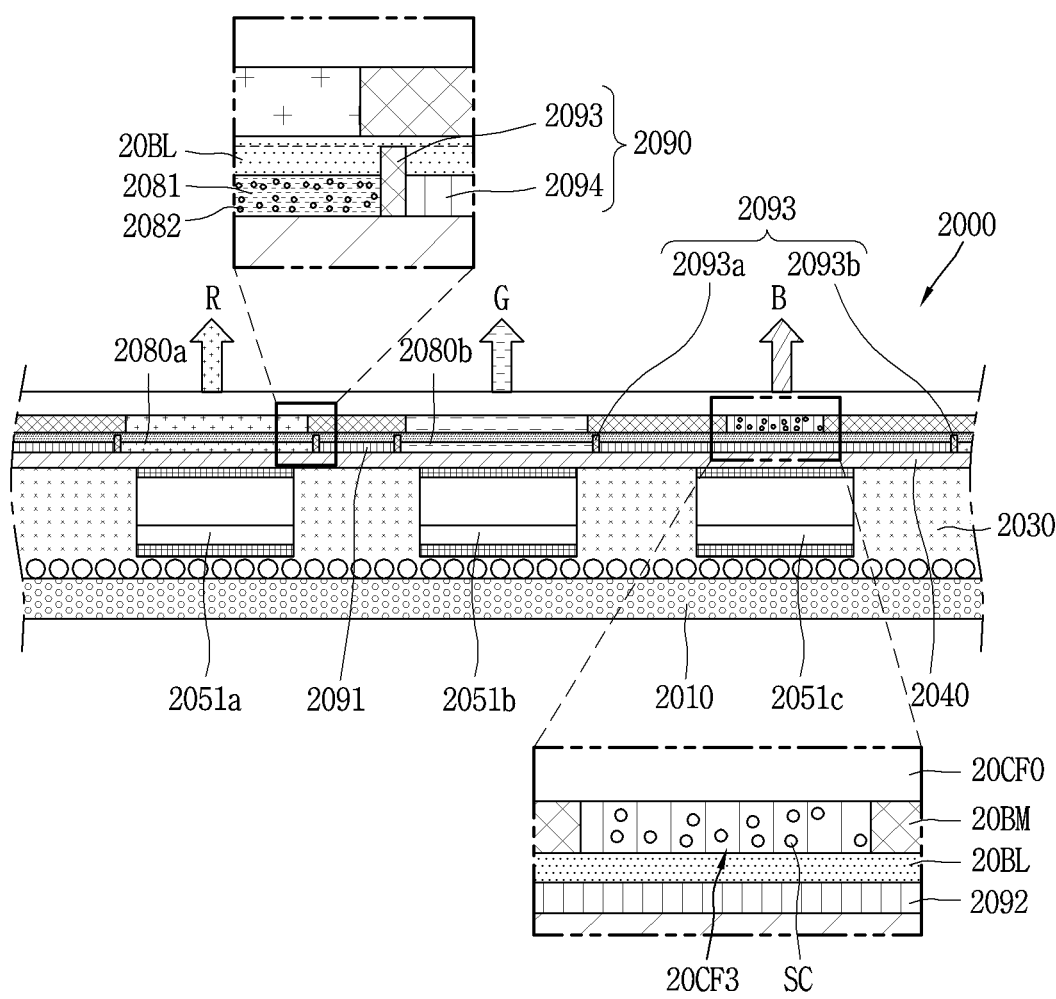
FIG. 16 is a cross-sectional view showing another embodiment of the present disclosure.
Figure 17:
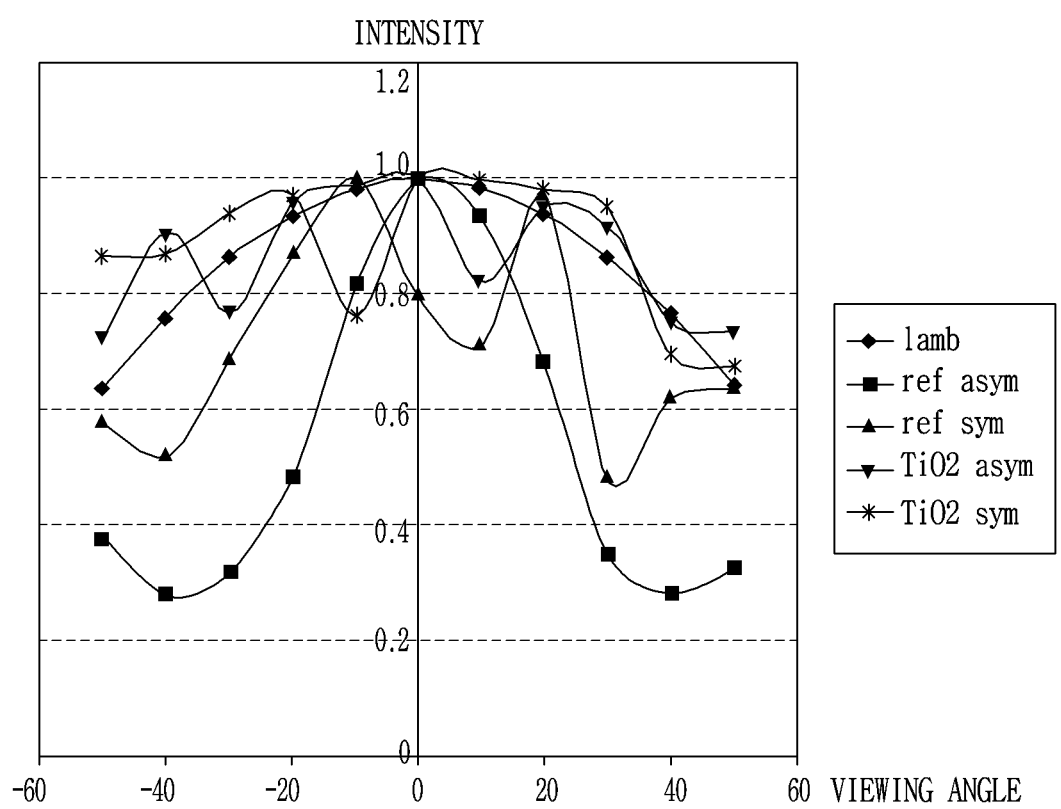
FIG. 17 is a graph showing viewing angle characteristics of a color filter in FIG. 16.

FIG. 16 is a cross-sectional view showing another embodiment of the present disclosure, and FIG. 17 is a graph showing viewing angle characteristics of a color filter in FIG. 16.

In the present example to be described below, the same or similar reference numerals are designated to the same or similar components as those of the example described above with reference to FIGS. 13 through 15, and the description thereof will be substituted by the earlier description. For example, the display device 2000 includes a substrate 2010, a first electrode 2020, a conductive adhesive layer 2030, a second electrode 2040, a plurality of semiconductor light emitting elements 2050, a phosphor layer 2080, and partition wall portions 2090, and the descriptions thereof will be substituted by the description with reference to FIGS. 13 through 15 as described above.

In the case of the color filter 20CF, a structure thereof is the same as the structure described with reference to FIGS. 13 through 15, but a material provided in the blue filtering portion 20CF3 is different.

More specifically, the blue filtering portion 20CF3 may include a light scattering or dispersing material in order to solve the problem of deterioration of the viewing angle characteristics in blue color. For such an example, the scattering agent (SC) may be mixed with the blue filtering portion 20CF3.

The light scattering or dispersing material may be a material having a refractive index (RI) value of 0.5 or more than that of the color filter dye. For example, for the scattering agent (SC), silica, SiO2, calcium carbonate, barites, clay, magnesium silicate, lithopone, zinc oxide, antimony oxide, zinc sulfide, rutile TiO2 and anatase TiO2 may be mixed with the blue filtering portion 20CF3.

In this example, the scattering agent (SC) is TiO2, and may have a size of 0.001 to 0.2 micrometers. For a specific example, rutile TiO2 having a good scattering property at a blue wavelength and an easily patternable property in a photo litho process may be provided at a size of 0.2 micrometers or less.

According to the illustration, the color filter may include a light-transmissive base member 20CF0 in which the plurality of filtering portions are sequentially disposed. The plurality of filtering portions each include a blue filtering dye, a green filtering dye, and a red filtering dye disposed on one side of the base member 20CF0, and the blue filtering dye may be mixed with the scattering agent (SC). In this case, the scattering agent (SC) may be mixed with 0.1% wt to 10% wt of the blue filtering dye.

More specifically, the blue filtering dye, the green filtering dye, and the red filtering dye may be sequentially arranged on the same plane, and a black matrix may be disposed between each of the dyes. In this case, the scattering agent (SC) is mixed only in the blue filtering dye, and the scattering agent is not mixed in the other dyes. Through this, the blue filter 20CF3 mixed with the TiO2, and the green filter 20CF1 and the red filter 20CF2 that are not mixed with the TiO2 may be sequentially arranged.

According to the structure described above, the viewing angle characteristics may be improved despite a narrow area of the blue filtering portion 20CF3. Referring to FIG. 17, it may be seen that an asymmetric color filter (ref asym) without TiO2 has worse viewing angle characteristics than a symmetric color filter (ref sym) without TiO2. However, according to the graph, it may be seen that the asymmetric color filter (TiO2 asym) mixed with TiO2 has better viewing angle characteristics than the symmetrical color filter (ref sym) without TiO2, and has similar viewing angle characteristics compared to the symmetric color filter (TiO2 sym) mixed with TiO2 or a Lambertian distribution.

As described above, in this example, as a light scattering or dispersing material in the asymmetric color filter having a relatively narrow blue filtering portion is mixed with the blue filtering portion, the viewing angle characteristics of blue may be improved while securing the luminance of red and green.

Meanwhile, the structure of the color filter described above may be modified into various forms. Hereinafter, these modifications will be described.

Figure 18A:
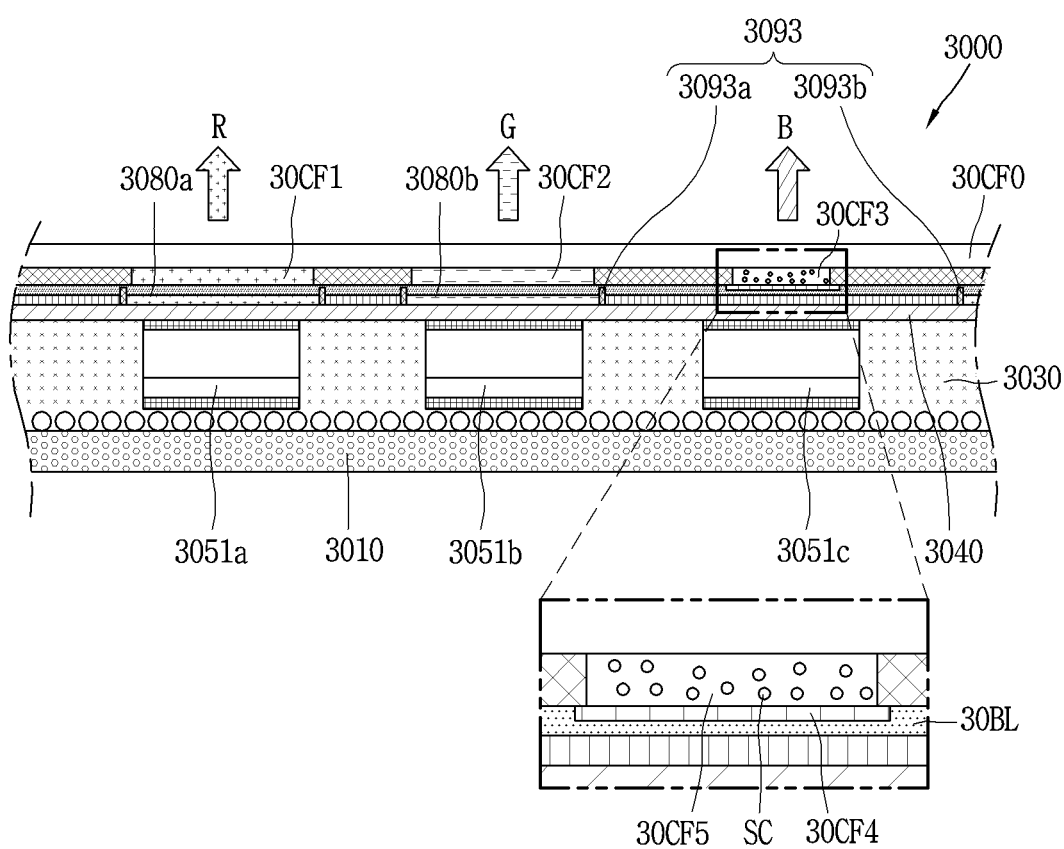
FIGS. 18A, 18B and 18C are cross-sectional views showing modification examples of the color filters of FIGS. 13 through 15, respectively.
Figure 18B:
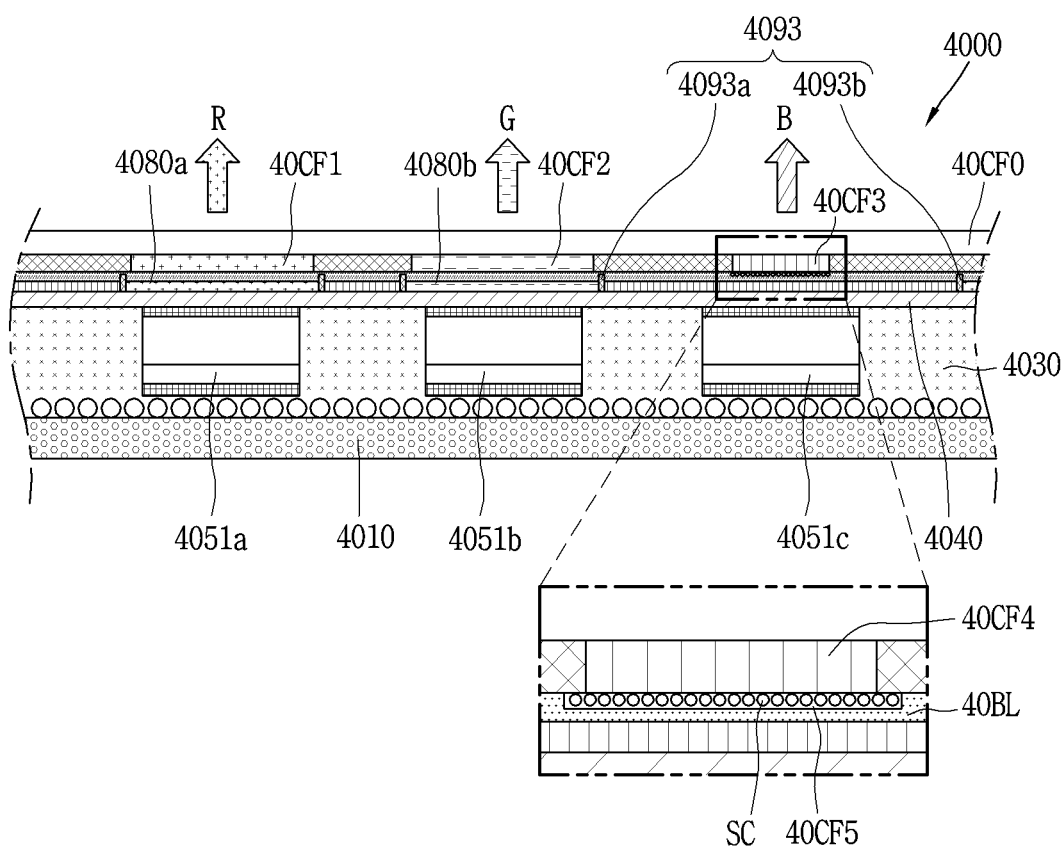
Figure 18C:
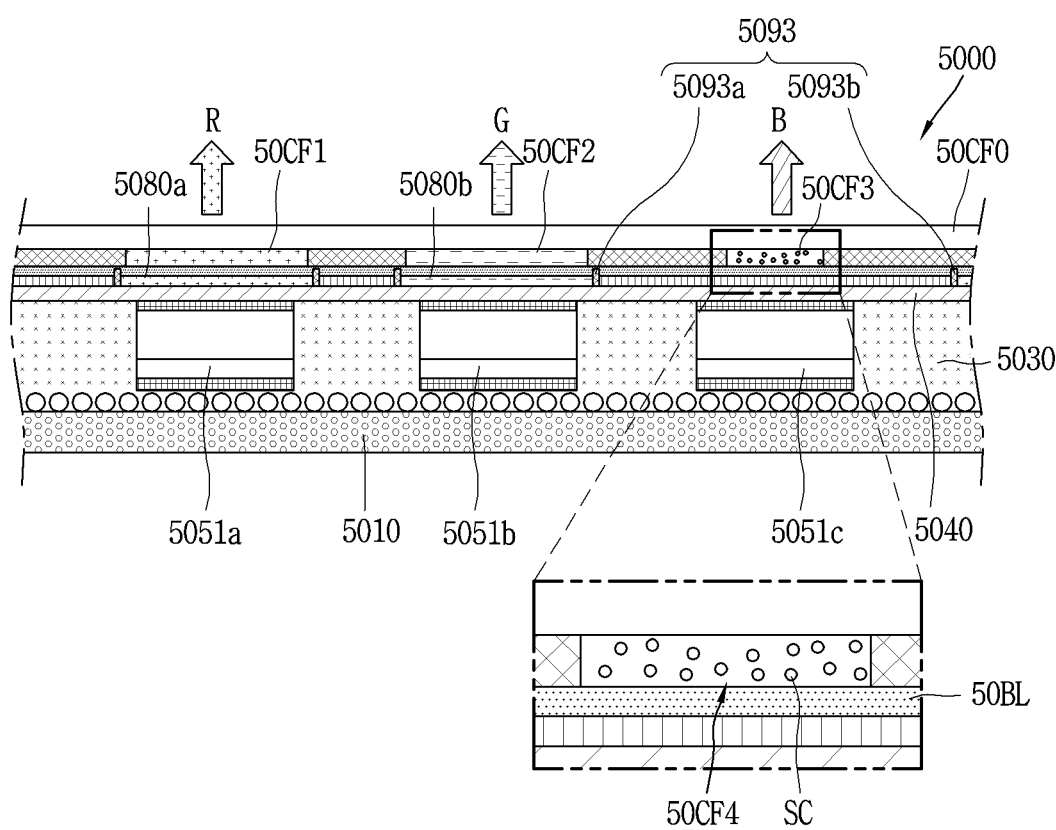

FIGS. 18A, 18B and 18C are cross-sectional views showing modification examples of the color filters of FIGS. 13 through 16, respectively.

In the present example to be described below, the same or similar reference numerals are designated to the same or similar components as those of the example described above with reference to FIGS. 13 through 16, and the description thereof will be substituted by the earlier description. For example, the display device 3000 includes a substrate 3010, a first electrode 3020, a conductive adhesive layer 3030, a second electrode 3040, a plurality of semiconductor light emitting elements 3050, and a wavelength conversion layer 30WL, and the descriptions thereof will be substituted by the description with reference to FIGS. 13 through 15 as described above.

As in the previous embodiment, the display device 3000 is disposed such that the color filter 30CF covers the wavelength conversion layer 30WL. More specifically, the color filter 30CF and the wavelength conversion layer 30WL may be combined by an adhesive layer 30BL. For example, as the adhesive layer 30BL is disposed between the color filter 30CF and the conversion layer 30WL, the color filter 30CF may be adhered to the conversion layer 30WL.

In this case, the color filter 30CF is made to selectively transmit light to implement red, green and blue colors. The color filter 30CF may be provided with a plurality of filtering portions for filtering a red wavelength, a green wavelength, and a blue wavelength, and may have a structure in which the plurality of filtering portions 30CF1, 30CF2, 30CF3 are repeatedly arranged. At this time, a red filtering portion 30CF1 and a green filtering portion 30CF2 for filtering red and green light are arranged on an upper side of the red phosphor layer 3080a and the green phosphor layer 3080b, respectively, and a blue filtering portion 30CF3 may be disposed to cover a partition wall portion 3092 of a portion constituting a blue pixel. A black matrix (BM) may be disposed between the plurality of filtering portions 30CF1, 30CF2, 30CF3.

In this case, in the color filter 30CF, at least one of the plurality of filtering portions 30CF1, 30CF2, and 30CF3 may be formed to have a width different from those of the other filtering portions. For example, at least one of the plurality of partition wall portions overlaps with at least one of the plurality of semiconductor light emitting elements along the thickness direction of the phosphor layer, and the filtering portion 30CF3 corresponding to a partition wall portion 3092 overlapping with at least one of the plurality of semiconductor light emitting elements among the plurality of filtering portions is configured to have a width different from those of the other filtering portions 30CF1, 30CF2.

More specifically, a width of at least one of green and red filtering portions 30CF1, 30CF2 is made to be different from that of the blue filtering portion 30CF3 in conjunction with further securing a filling space for green and red phosphors, thereby forming an asymmetric color filter. In this case, the second partition wall portion 3092 covering the blue semiconductor light emitting element overlaps with the blue filtering portion 30CF3, and a width of the blue filtering portion 30CF3 may be formed to have a smaller width than those of the green and red filtering portions 30CF1, 30CF2.

According to the illustration, the color filter may include a light-transmissive base member 30CF0 in which the plurality of filtering portions 30CF1, 30CF2, 30CF3 are sequentially disposed. In this case, the plurality of filtering portions may each include a blue filtering dye, a green filtering dye, and a red filtering dye arranged in the base member 30CF0, and the blue filtering dye may form a first layer 30CF4, and the first layer may be disposed to overlap with a light scattering or dispersing material, for example, a second layer 30CF5 having a scattering agent (SC) in the example described with reference to FIG. 15.

For example, the second layer 30CF5 may be a layer in which the scattering agent (SC) is mixed with light-transmitting photoresist, and overlaps with the first layer 30CF4. In this case, as the scattering agent, TiO2 may be mixed with 0.1% wt to 10% wt of the photoresist.

More specifically, referring to FIG. 18A, the second layer 30CF5 may be sequentially arranged on one side of the base member together with the green filtering dye and the red filtering dye. Here, the first layer 30CF4 is disposed below the second layer 30CF5 (that is, disposed between the second layer 30CF5 and the adhesive layer 30BL) to filter blue light.

For another example, referring to FIG. 18B, a plurality of filtering portions 40CF1, 40CF2, 40CF3 may respectively include a blue filtering dye, a green filtering dye, and a red filtering dye, which are sequentially arranged on one side of the base member 40CF0. Here, the second layer 40CF5 is disposed below the first layer 40CF4 to scatter light prior to filtering blue light. Moreover, a modification example of the blue filter 30CF3, 40CF3 disclosed above in FIGS. 18A and 18B may also be alternately arranged in one display device.

For another example, referring to FIG. 18B, a plurality of filtering portions 50CF1, 50CF2, 50CF3 may each sequentially include a blue filtering dye, a green filtering dye, and a red filtering dye having a light scattering or dispersing material on one side of the base member 50CF0. Here, the blue filtering portion does not include the blue filtering dye, and a first layer 50CF4 is disposed to scatter blue light. The first layer 50CF4 may be a layer in which the scattering agent (SC) is mixed with the light-transmitting photoresist. In this case, as the scattering agent, TiO2 may be mixed with 0.1% wt to 10% wt of the photoresist.

According to the structure of a new color filter as described above, it may be possible to implement a display device capable of securing the amount of light of green or red and improving the viewing angle characteristics of blue. Hereinafter, a method of fabricating a new color filter as described above will be described in detail with reference to the accompanying drawings. FIGS. 19A, 19B, 19C, 20A, 20B and 20C are cross-sectional views showing a method of fabricating a color filter of the present disclosure.

First, a method of fabricating a structure in which TiO2 is mixed with a blue filtering dye will be described with reference to FIGS. 19A, 19B and 19C.

Figure 19A:
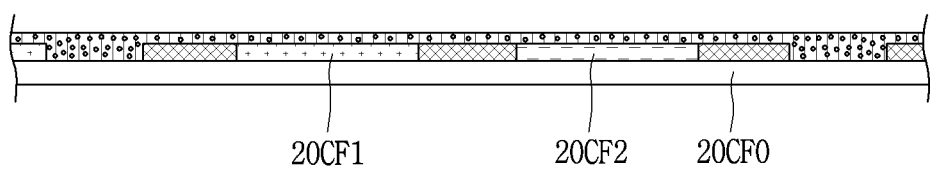
FIGS. 19A, 19B, 19C, 20A, 20B and 20C are cross-sectional views showing a method of manufacturing a display device using the semiconductor light emitting element of the present disclosure.

Referring to FIG. 19A, a black matrix 20BM, a green filtering portion 20CF1 and a red filtering portion 20CF2 are formed on a base member 20CF0, for example, a polyimide film, and a blue filtering dye mixed with TiO2 is coated thereon. At this time, the blue filtering dye may be a photoresist.

Figure 19B:
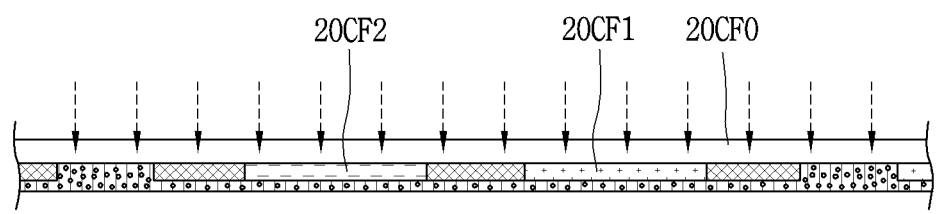

Next, the polyimide film is turned upside down, and the entire surface is exposed (FIG. 19B). At this time, red and green may be self-aligned through the color pattern. In other words, the red filtering dye and the green filtering dye become photoresists, and therefore, the blue filtering dye mixed with TiO2 disappears except for a portion corresponding to the blue pixel.

Figure 19C:
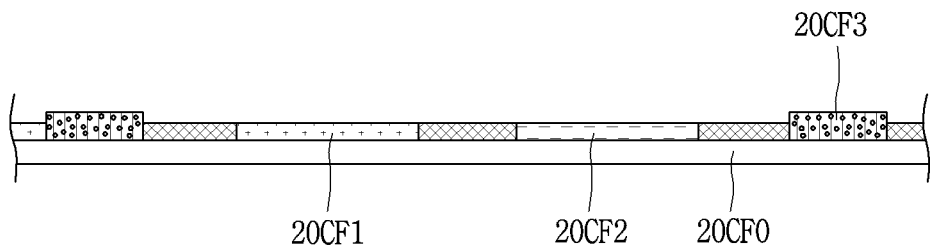

Finally, the photoresist is developed to complete the pattern of the color filter (FIG. 19C). By this process, the blue filtering portion 20CF3 may contain TiO2.

First, a method of fabricating a structure in which TiO2 is mixed with a blue filtering dye will be described with reference to FIGS. 19A, 19B and 19C.

Figure 20A:
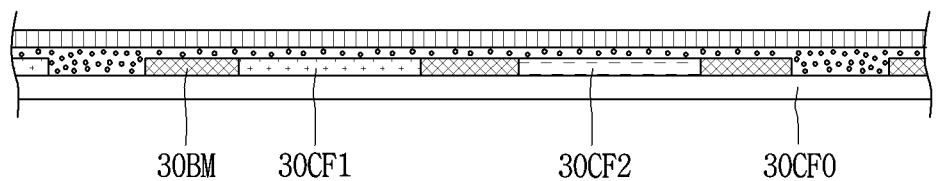
Figure 20B:
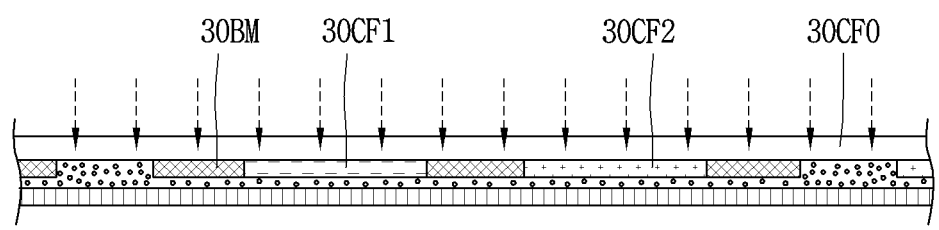

Referring to FIG. 20A, a black matrix 30BM, a green filtering portion 30CF1, and a red filtering portion 30CF2 are formed on a base member 30CF0, for example, a polyimide film, and a light-transmitting photoresist mixed with TIO2 is coated thereon. Thereafter, a blue filtering dye is applied to an upper surface of the light-transmitting photoresist. Even in this case, the blue filtering dye may be a photoresist.

Next, the polyimide film is turned upside down, and entire exposure is carried out (FIG. 19B). Similarly to the fabrication process of FIG. 19B, red and green are self-aligned through the color pattern, and thus the second layer 30CF5 mixed with TiO2 and the first layer 30CF4 of the blue filtering dye disappear except for a portion corresponding to the blue pixel. Finally, the photoresist and the blue filtering dye are developed to complete the pattern of the color filter (FIG. 20C).

Figure 20C:
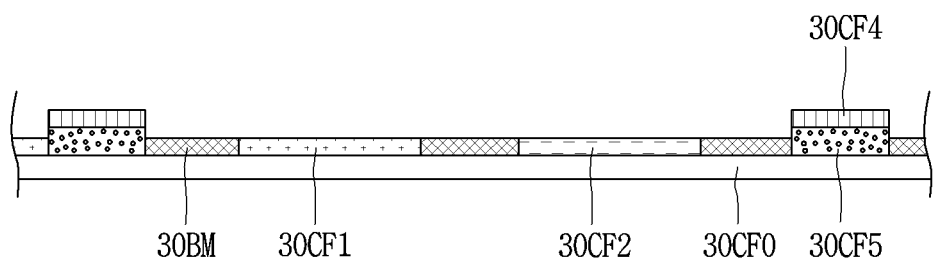

The color filters completed in FIGS. 19C and 20C are arranged to cover the foregoing wavelength conversion layer to implement three primary colors of blue, red and green in the display device.

The configurations and methods according to the above-described embodiments will not be applicable in a limited way to the foregoing display device using a semiconductor light emitting element, and all or part of each embodiment may be selectively combined and configured to make various modifications thereto.

What is claimed is:

1. A display device, comprising:
a substrate on which a plurality of wiring electrodes are disposed;
a plurality of semiconductor light emitting elements electrically connected to the plurality of wiring electrodes;
a wavelength conversion layer including a plurality of phosphor layers for converting wavelengths of light and a plurality of partition wall portions formed between the plurality of phosphor layers, the wavelength conversion layer covering the plurality of semiconductor light emitting elements; and
a color filter including a plurality of filtering portions for filtering different colors and black matrices disposed between the plurality of filtering portions, the color filter covering the wavelength conversion layer,
wherein the plurality of partition wall portions comprise a first partition wall portion disposed to cover portions between the plurality of semiconductor light emitting elements, and a second partition wall portion configured to cover at least one of the plurality of semiconductor light emitting elements,
wherein the plurality of filtering portions comprise a blue filtering portion, a green filtering portion and a red filtering portion,
wherein the blue filtering portion is different in width from at least one of the green filtering portion and the red filtering portion and overlaps with the second partition wall portion, and
wherein the black matrices comprise a first black matrix disposed between the green filtering portion and the red filtering portion and being aligned on a same line as the first partition wall portion.

2. The display device of claim 1, wherein each of a width of the green filtering portion and a width of the red filtering portion is approximately 5 to 50% larger than a width of the blue filtering portion.

3. The display device of claim 1, wherein the black matrices further include:
a second black matrix and a third black matrix disposed on opposite sides of the blue filtering portion so that an overlapped portion with the second partition wall portion is larger than a non-overlapped portion therewith.

4. The display device of claim 1, wherein at least one of the plurality of semiconductor light emitting elements covered by the second partition wall portion comprises a blue semiconductor light emitting element.

5. The display device of claim 1, wherein at least one of the plurality of filtering portions having a width different from another one of the plurality of filtering portions comprises a light scattering material or a light dispersing material.

6. The display device of claim 5, wherein the light scattering material or the light dispersing material includes $TiO_2$, and has a particle size of approximately 0.001 to 0.2 micrometers.

7. The display device of claim 6, wherein the $TiO_2$ comprises rutile $TiO_2$.

8. The display device of claim 1, wherein the color filter comprises a light-transmissive base member in which the plurality of filtering portions are sequentially arranged.

9. The display device of claim 8, wherein the plurality of filtering portions comprise a blue filtering dye, a green filtering dye, and a red filtering dye arranged on one side of the light-transmissive base member, and
the blue filtering dye is mixed with a light scattering material or a light dispersing material.

10. The display device of claim 9, wherein the blue filtering dye, the green filtering dye, and the red filtering dye are sequentially arranged on a same plane.

11. The display device of claim 8, wherein the plurality of filtering portions comprise a blue filtering dye, a green filtering dye, and a red filtering dye arranged on one side of the light-transmissive base member, and
the blue filtering dye forms a first layer, and the first layer is disposed to overlap with a second layer having a light scattering material or a light dispersing material.

12. The display device of claim 11, wherein in the second layer, the light scattering material or the light dispersing material is mixed with a light-transmissive photoresist.

13. The display device of claim 12, wherein the light scattering material or the light dispersing material is mixed with approximately 0.1% wt to 10% wt of the light-transmissive photoresist.

14. The display device of claim 1, wherein the plurality of phosphor layers comprise resin and inorganic phosphor mixed with the resin.

15. A color filter comprising:
a plurality of filtering portions for filtering blue, green, and red colors,
wherein the plurality of filtering portions comprise a blue filtering portion, a green filtering portion, and a red filtering portion,
the blue filtering portion has a width different from a width of at least one of the green filtering portion and the red filtering portion, and
wherein the blue filtering portion comprises a light scattering material or a light dispersing material.

16. The color filter of claim 15, wherein each of the width of the green filtering portion and the width of the red filtering portion is approximately 5 to 50% larger than the width of the blue filtering portion.

17. A display device, comprising:
a substrate on which a plurality of wiring electrodes are disposed;
a plurality of semiconductor light emitting elements electrically connected to the plurality of wiring electrodes;
a wavelength conversion layer including a plurality of phosphor layers for converting wavelengths of light and a plurality of partition wall portions formed between the plurality of phosphor layers, the wavelength conversion layer covering the plurality of semiconductor light emitting elements; and
a color filter including a plurality of filtering portions for filtering different colors, the color filter covering the wavelength conversion layer,
wherein at least one of the plurality of filtering portions has a width different from a width of another one of the plurality of filtering portions, and
wherein the at least one of the plurality of filtering portions having the width different from the another one of the plurality of filtering portions comprises a light scattering material or a light dispersing material.

* * * * *